United States Patent
Yeh et al.

(10) Patent No.: US 10,847,523 B1
(45) Date of Patent: Nov. 24, 2020

(54) STACKED MEMORY AND ASIC DEVICE

(71) Applicant: Macronix International Co., Ltd., Hsinchu (TW)

(72) Inventors: Teng-Hao Yeh, Hsinchu (TW); Chih-Wei Hu, Miaoli (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/503,375

(22) Filed: Jul. 3, 2019

(51) Int. Cl.
| | |
|---|---|
| H01L 21/02 | (2006.01) |
| H01L 27/11507 | (2017.01) |
| H01L 27/11504 | (2017.01) |
| H01L 27/11514 | (2017.01) |
| H01L 27/11512 | (2017.01) |
| H01L 27/11509 | (2017.01) |

(52) U.S. Cl.
CPC .. *H01L 27/11507* (2013.01); *H01L 27/11504* (2013.01); *H01L 27/11509* (2013.01); *H01L 27/11512* (2013.01); *H01L 27/11514* (2013.01)

(58) Field of Classification Search
CPC combination set(s) only.
See application file for complete search history.

(56) References Cited

U.S. PATENT DOCUMENTS

| | | |
|---|---|---|
| 8,970,047 B2 | 3/2015 | Chen |
| 9,147,672 B1 | 9/2015 | Chen |
| 9,240,405 B2 | 1/2016 | Chen et al. |
| 10,211,218 B2 | 2/2019 | Lue |
| 2009/0097321 A1* | 4/2009 | Kim ............... H01L 29/42336 365/185.18 |
| 2010/0225000 A1* | 9/2010 | Sugizaki ............. H01L 25/50 257/773 |
| 2011/0031630 A1* | 2/2011 | Hashimoto ....... H01L 27/11578 257/774 |
| 2012/0068241 A1* | 3/2012 | Sakuma ........... H01L 27/11551 257/314 |
| 2014/0264934 A1* | 9/2014 | Chen ................ H01L 27/11551 257/774 |

(Continued)

OTHER PUBLICATIONS

Katsumata et al., "Pipe-shaped BiCS Flash Memory with 16 Stacked Layers and Multi-Level-Cell Operation for Ultra High Density Storage Devices", 2009 Sypmposium on VLSI technology Digest of Technical Papers, p. 136-137.

*Primary Examiner* — Niki H Nguyen
(74) *Attorney, Agent, or Firm* — Haynes Beffel & Wolfeld LLP

(57) ABSTRACT

Roughly described, the invention involves a device including a memory chip having a memory array, bit lines in communication with data carrying nodes of the memory array, and word lines in communication with certain gate control nodes of the memory array. The memory chip has bonding pads formed on an interconnect surface at respective memory chip interconnect locations. Each of the bit lines and each of the word lines of the memory array includes a respective landing pad in a conductive layer of the chip, and these landing pads connected via redistribution conductors to respective ones of the set of memory chip bonding pads. The redistribution conductors for the bit lines have a positive average lateral signal travel distance which is less than that of the redistribution conductors for the word lines.

25 Claims, 14 Drawing Sheets
(8 of 14 Drawing Sheet(s) Filed in Color)

(56) References Cited

U.S. PATENT DOCUMENTS

| | | | |
|---|---|---|---|
| 2016/0181257 A1* | 6/2016 | Liaw | H01L 29/7851 |
| | | | 257/401 |
| 2019/0067110 A1* | 2/2019 | Or-Bach | H01L 27/11206 |
| 2019/0164975 A1* | 5/2019 | Song | H01L 27/10814 |
| 2019/0319044 A1* | 10/2019 | Harari | H01L 27/11573 |
| 2020/0027509 A1* | 1/2020 | Chen | H01L 27/11548 |
| 2020/0027892 A1* | 1/2020 | Zhu | H01L 21/76802 |
| 2020/0066741 A1* | 2/2020 | Wu | H01L 29/7889 |
| 2020/0176420 A1* | 6/2020 | Or-Bach | H01L 25/50 |
| 2020/0194439 A1* | 6/2020 | Kim | H01L 27/10855 |
| 2020/0203354 A1* | 6/2020 | Lee | H01L 27/10888 |

* cited by examiner

STACKED MEMORY AND ASIC DEVICE

BACKGROUND

Field

The present invention relates generally to integrated circuit memory devices.

Description of Related Art

In the manufacturing of high density memory devices, the amount of data per unit area on an integrated circuit can be a critical factor. Thus, as the critical dimensions of the memory devices approach technology limits, techniques for stacking multiple levels of memory cells have been proposed in order to achieve greater storage density and lower costs per bit. Also, new memory technologies are being deployed, including phase change memory, ferromagnetic memory, metal oxide based memory and so on.

The memory technologies being deployed can require a different sequence of manufacturing steps, than do the supporting peripheral circuits such as the logic for address decoders, state machines, and command decoders. As a result of the need to support the manufacturing steps for both the memory array and the peripheral circuits, the manufacturing lines needed to implement memory devices can be more expensive, or compromises are made in the type of circuitry implemented in the peripheral circuits. This leads to higher costs for integrated circuits made using more advanced technologies.

In Chen U.S. Pat. No. 9,240,405, incorporated herein by reference, there is described a memory device with off-chip peripheral circuits. The device is suitable for low cost manufacturing. The memory circuit and peripheral circuit for the device are implemented in different layers of a stacked structure. The memory circuit layer and the peripheral circuit layer include complementary interconnect surfaces, which upon mating together establish the electrical interconnection between the memory circuit and the peripheral circuit. The memory circuit layer and the peripheral circuit layer can be formed separately using different processes on different substrates in different fabrication lines. The separate circuitry can then be stacked and packaged together.

The concept offers a number of benefits. First, the circuitry normally located in the peripheral region of a memory chip, such as sense amplifiers, row and column decoders, and controllers, can be moved to the peripheral circuit layer, leaving not much more than the memory array itself on the memory circuit chip. Minimal die size therefore can be achieved on the memory circuit chip, improving yield. Second, each of the two chips can be fabricated using processes which are optimal for its specific needs. For example, the memory circuit chip can be fabricated in multiple layers for a 3D memory array, whereas the peripheral circuit chip can be fabricated with processes optimized for advanced CMOS technology, thus improving outcomes for both. Third, direct bonding of memory array nodes with the peripheral circuit chip, which can be an ASIC chip, can implement recently promoted "in-memory computation" or "processor in memory" techniques for optimizing the Von Neumann architectures. Such direct bonding allows much less data movements, shorter latency, and less power consumption.

A problem arises, however, in that a potentially large number of connections may be required from one chip to the other. These can include at least one connection for each bit line of the memory circuit, and at least one for each word line. In three-dimensional memory arrays as well as some other memory array structures, additional connections may be needed for such conductors as common source lines, string select lines, ground select lines, and power lines, for example. Together these can require many thousands of interconnections. Because the interconnections typically include bonding pads which are much larger than the conductors that carry electrical signals to or from them in the memory circuit, often they cannot be positioned very near to the memory circuit conductors to which they connect. In some cases the memory circuit signals must travel great distances laterally in order to reach their assigned interconnect pads. As a result, memory bandwidth may be limited and the lateral extension conductors may create additional parasitic RC delay during bit line or word line setup operations, and higher power consumption.

SUMMARY

The aforesaid problems are ameliorated by a method according to independent claim 21 as well as a device according to independent claim 1. Further features and details of the invention result from the dependent claims, the description and the figures. Features and details discussed with respect to the inventive method therefore are also correlated with the inventive device and vice-versa.

Roughly described, the invention involves a device including a memory chip having a memory array, bit lines in communication with data carrying nodes of the memory array, and word lines in communication with certain gate control nodes of the memory array. The memory chip has bonding pads formed on an interconnect surface at respective memory chip interconnect locations. Each of the bit lines and each of the word lines of the memory array includes a respective landing pad in a conductive layer of the chip, and these landing pads connected via redistribution conductors to respective ones of the set of memory chip bonding pads. The redistribution conductors for the bit lines have a positive average lateral signal travel distance which is less than that of the redistribution conductors for the word lines.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
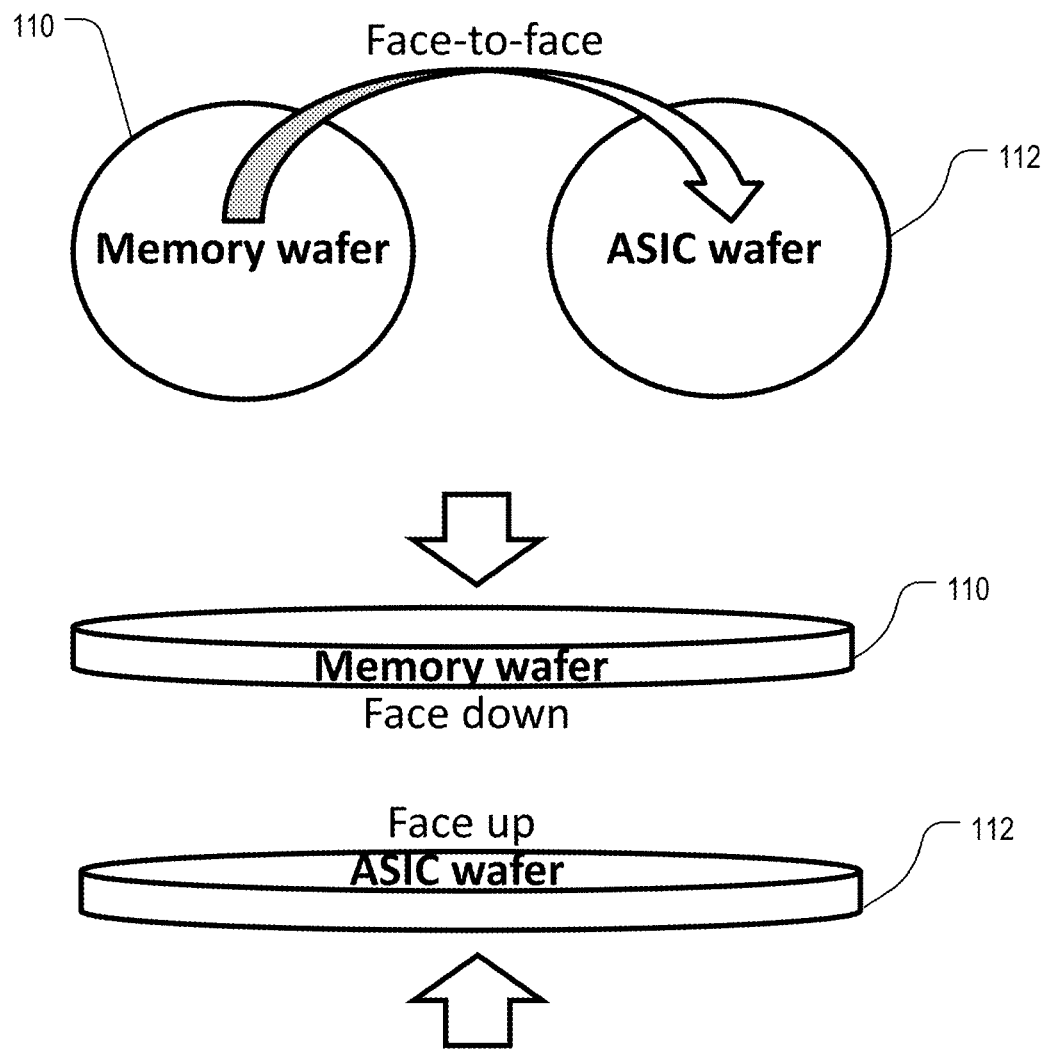
FIG. 1 is a symbolic diagram of a memory wafer and an ASIC wafer incorporating aspects of the invention.

FIG. 1 is a symbolic diagram of a memory wafer 110 on which a plurality of memory circuits have been fabricated, and an ASIC wafer 112 on which sense amplifiers and other bias generators and support circuitry for the memory circuits have been fabricated. The ASIC wafer 112 may also include other advanced CMOS devices such as a processor, a central processing unit, a general-purpose processor, a logic controller, a state machine, an arithmetic logic unit, an array processing unit, a graphics processing unit, a memory management unit, cache memory, SRAM, and input/output controllers. As shown in the figure, the memory wafer 110 and the ASIC wafer 112 are attached to each other face-to-face. After flipping over, the back-side of the memory wafer will be nearest the printed circuit board or other support structure. In one embodiment the two wafers are first joined and later diced, whereas in another embodiment the two wafers are first diced and later joined.

Figure 2:
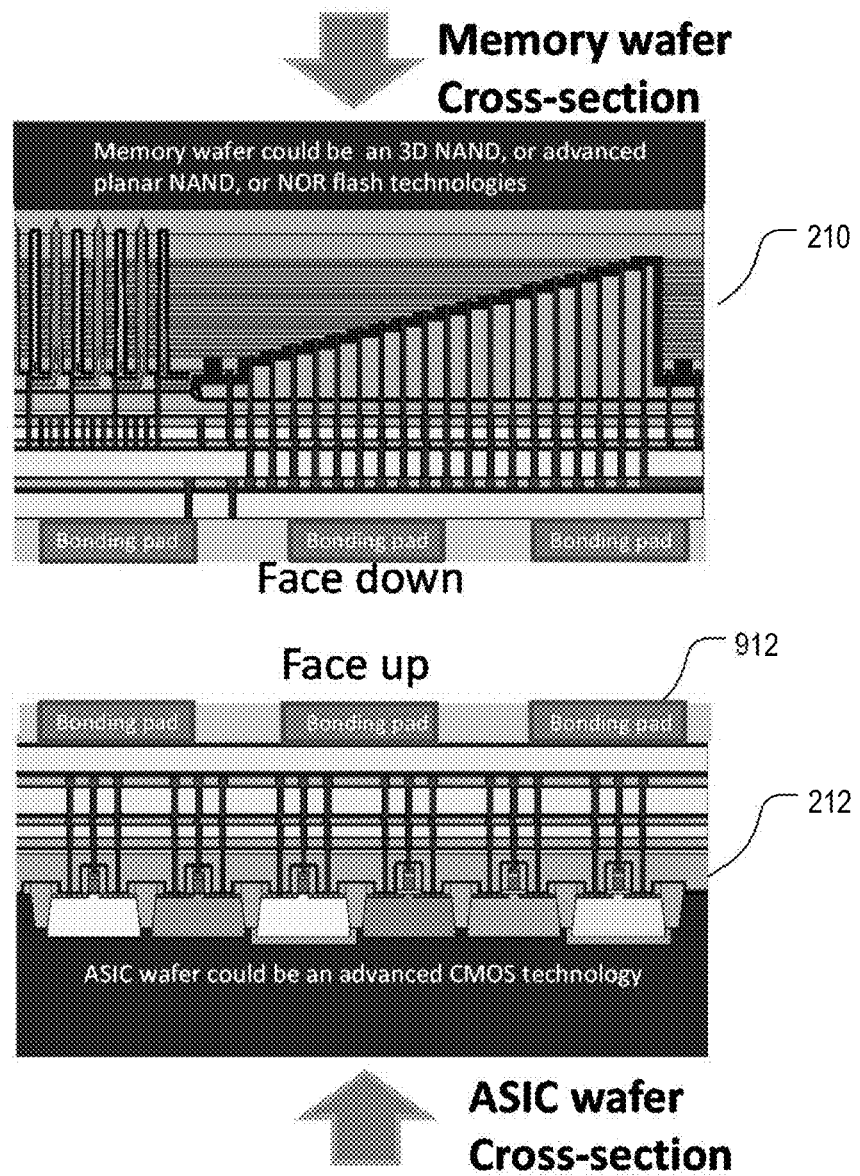
FIG. 2 is a symbolic diagram in cross-sectional view of an ASIC chip from the ASIC wafer of FIG. 1, and a memory chip from memory wafer of FIG. 1.

FIG. 2 is a symbolic diagram in cross-sectional view of an ASIC chip 212 from ASIC wafer 112, and a memory chip 210 from memory wafer 110. The ASIC chip 212 is shown as having fabricated thereon a number of transistors with source drain and gate contacts extending up to an interconnect layer of the chip. Three bonding pads are shown, with their top surfaces exposed to the downward-facing memory chip 210 above. As with FIG. 1, the two chips are shown upside-down compared to their final arrangement in which the backside of the memory chip 210 is against the PC board. The memory chip 210 is shown symbolically as including a 3D memory array fabricated thereon, with conductive plugs extending from various array nodes upward (downward in the drawing) to a redistribution layer, and then to three bonding pads with their top surfaces (face down in the drawing) exposed to the ASIC chip 212 below. The chip 212 may be any peripheral chip, not only an ASIC chip. As used herein, a "peripheral chip" at a minimum includes sense amplifiers, but can also include any other logic, including CPUs, state machines, ALUs, etc. The term "peripheral chip" is intended herein to include all such variations.

Figure 3:
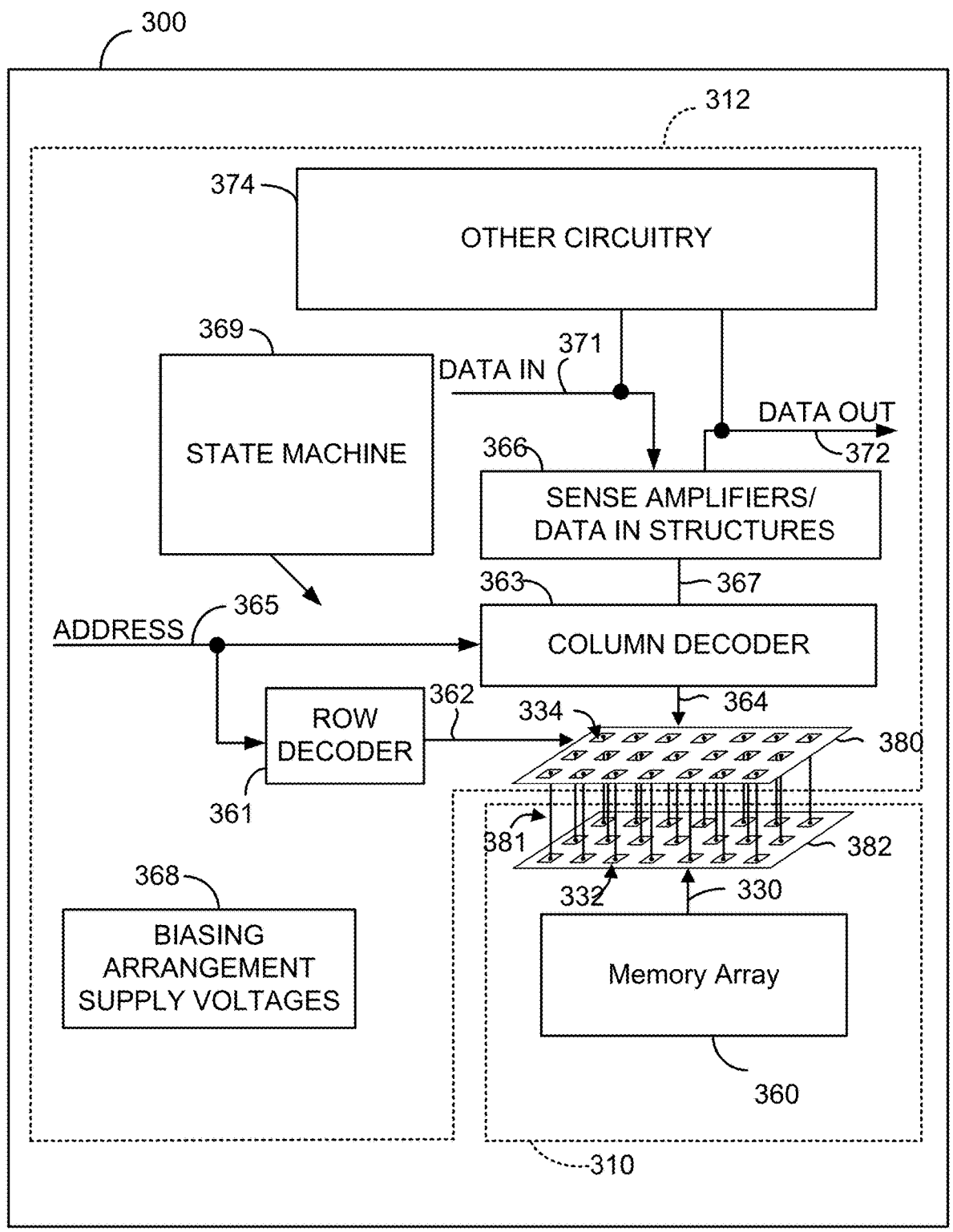
FIG. 3 is a simplified block diagram of a stacked integrated circuit device including a memory circuit and a peripheral circuit.

Though the memory circuit chip 210 and the peripheral circuit chip 212 each constitutes in independent product in itself, further benefits are obtained when they are joined together via an interconnect interface 381 (FIG. 3). The terms "joined" or "joining" as used herein refer to configurations where the memory circuit chip 210 is attached, affixed or otherwise physically connected to the peripheral circuit chip 212. The terms encompass configurations where the memory circuit chip 210 is directly affixed to the peripheral circuit chip 212, such as through bonding. The terms further encompass configurations whereby the memory circuit chip 210 is indirectly connected to the peripheral circuit chip 212 through the use of intermediate "interposer" member or element. Additionally, though the bonding pads on the chip 210 appear in FIG. 2 to match positions with the bonding pads on the chip 212, it will be appreciated that in a particular embodiment they need not necessarily match positions, or match positions exactly, especially if an interposer is used. Nor does every pad on either chip necessarily have a corresponding pad on the other chip.

FIG. 3 is a simplified block diagram of a stacked integrated circuit device 300 including a memory circuit 310 and a peripheral circuit 312. The memory circuit 310 and the peripheral circuit 312 are physically separated onto different layers of the device 300, and are joined via interconnect interface 381. The memory circuit 310 includes a memory array 360. Word lines (not shown) are arranged along rows in the memory array 360. Bit lines (not shown) are arranged along columns in the memory array 360 for reading and programming the memory cells (not shown) in the memory array 360. As used herein, the term "access line" refers generally to bit lines, source lines, and/or word lines. The memory circuit 310 may also include other circuitry, such as high voltage transistors or drivers, which may provide better performance when included on the same chip as the memory array 360.

The memory circuit 310 includes an interconnect surface 382 having a set of interconnect pads (also called bonding pads) 332. The interconnect pads 332 are arranged at interconnect locations that form a pattern that defines the vertical electrical interconnection interface of the memory circuit 310. FIG. 3 illustrates a small section of the interconnect surface 382 that can include thousands of bonding pads 332. The bonding pads 332 are coupled to corresponding access lines in the memory array 360 via conductors 330, thereby enabling the selection of specific rows or columns of the memory array 360 as described below.

The memory array 360 may implement a variety of different 2D or 3D memory architectures. The memory array 360 may also implement a variety of different kinds of memory cells, including varieties of random access memory, read only memory, and other nonvolatile memory, using storage technologies such as floating gate, charge trapping, programmable resistance, phase change, etc. In some embodiments, the memory array 360 is implemented using stacked thin film transistor structures such as those described in U.S. Pat. Nos. 7,473,589 and 7,709,334, the disclosures of which are incorporated by reference herein.

The peripheral circuit 312 also includes an interconnect surface 380 having bonding pads at a set of interconnect locations 334. The interconnect locations 334 are arranged in a pattern that defines the vertical electrical interconnection interface of the peripheral circuit 312.

The interconnect interface 381 between the interconnect surface 382 and the and the interconnect surface 380 serves to electrically connect specific peripheral device bonding pads 334 to corresponding memory device bonding pads 332. The interconnect interface 381 also serves to electrically isolate remaining bonding pads 332, 334 from one another. In doing so, the interconnect interface 381 vertically connects the peripheral circuit 312 to individual access lines or other memory array nodes in the memory array 360.

The peripheral circuit 312 provides the control signals such as bias signals, timing signals, switch control signals and so on, for operation of the memory circuit 310. As used herein, the term "signal" includes electrical communication for all purposes, including information-carrying signals (such as data and control signals) as well as power. The peripheral circuit 312 includes conductors 362 coupled to the word lines in the memory array 360 via the complementary bonding pads 382, 380 and bonding pads 381. The conductors 362 extend to a row decoder 361. Conductors 364 couple a column decoder 363 to the bit lines in the memory array 360 via the bonding pads 382, 380, interconnect interface 381 and conductors 330. Addresses are supplied on bus 365 to row decoder 361 and column decoder 363. Sense amplifiers and data-in structures 366 are coupled to the column decoder 363 in this example via data bus 367. The column decoder 363 and sense amplifiers in block 366 can be arranged in a page buffer structure allowing for wide, parallel read and write operations. Data is supplied via the data-in line 371 from input/output ports on the integrated circuit memory device 300, to the data-in structures in block 366. In the illustrated embodiment, other circuitry 374 is included in the peripheral circuit 312, such as a general purpose processor or special purpose application circuitry, or a combination of modules providing system-on-a-chip functionality supported by the memory array 360. Data is supplied via the data-out line 372 from the sense amplifiers in block 366 to input/output ports on the peripheral circuit 312, or to other destinations internal or external to the integrated circuit 312.

A controller implemented in this example using bias arrangement state machine 369 controls the application of bias arrangement supply voltages generated or provided through the voltage supply or supplies in block 368, such as read and program voltages. These bias arrangement supply voltages, as well as other control signals, are then provided to the memory circuit 310 through the bonding pads 382, 380 and interconnect interface 381. The controller can be implemented using special-purpose logic circuitry as known in the art. In alternative embodiments, the controller comprises a general-purpose processor, which may be implemented in the peripheral circuit 312, which executes a computer program to control the operations of the device 300. In yet other embodiments, a combination of special-purpose logic circuitry and a general-purpose processor may be utilized for implementation of the controller.

A variety of different techniques can be used for stacking the peripheral circuit 312 and the memory circuit 310 to establish the electrical interconnection via the interconnect interface 381. For example, a patterned conductive material may be applied to one or both of the interconnect surfaces 382, 380. The material may for example be a conductive bonding adhesive or a solder material. The peripheral circuit 312 and the memory circuit 310 can then be stacked such that the interconnect surfaces 382, 380 are mated directly together, thereby mating corresponding ones of the bonding pads from both chips.

In some embodiments, the interconnect interface 381 includes an interposer inserted between the interconnect surfaces 382, 380. An interposer can comprise a semiconductor substrate with metal layers arranged to conduct signals between the interconnect surfaces, and including structures like TSV technology for coupling contacts on one side of the interposer with the other. The interposer includes opposite sides with respective interconnect locations. Conductive members extending between the interconnect locations form conductive pathways between the opposite sides. In some embodiments, the interposer can include additional circuitry, such as amplifiers repeaters, inductors, capacitors and diodes, to support the communication of signals and impedance matching between the layered memory and peripheral circuitry. As used herein, two nodes described as being "in communication with" each other do not have to be in continuous communication with each other. The term also includes arrangements which include a series-connected switch in between them which can temporarily block the passage of information or electrical current.

The physical separation of the memory circuit 310 and the peripheral circuit 312 enables the use of independent fabrication process technologies, one for the memory circuit 310 and another for the supporting peripheral circuit 312 (and yet another for the optional interposer). For example, the memory circuit 310 and the peripheral circuit 312 can be formed separately using different processes on different substrates in different fabrication lines. As a result, the peripheral circuit 312 can be formed using logic only processes such as those used to form static random access memory (SRAM), rather than the more complicated combined logic/memory processes used for conventional memory. This results in the ability to design a high performance peripheral circuit 312 at low cost. Similarly, the memory circuit 310 can be fabricated using a memory process technology without consideration for the fabrication process technology of the peripheral circuit 312.

Even with the cost of the joining processes, the separate formation of the memory circuit 310 and the peripheral circuit 312 can lower the net cost per memory cell considerably. For example, assume that the memory circuit 310 and the peripheral circuit 312 occupy the same die area and their respective process technologies include no common process steps. Also assume that memory circuit 310 and the peripheral circuit 312 each requires the formation of 20 layers of material, at a cost of $50 per layer. Under these assumptions, forming the memory circuit 310 together with the peripheral circuit 312 would result in a die cost of about (20*$50+ 20*$50)/1000, or $2. In contrast, forming the memory circuit 310 and the peripheral circuit 312 separately results in a die cost of about (20*$50/2000)+(20*$50/2000)+cost of stacking and bonding, or $1 plus the cost of joining processes. Therefore if the cost of joining the circuits is less than $1, then separating the memory and peripheral circuits will be less costly that implementing them on a single wafer.

The physical separation of the memory circuit 310 and the peripheral circuit 312 also enables modularization of each. This modularization can provide different operating modes, such as different read or write operations, for different memory cells on the same memory device 300. These different operating modes enable different memory cells to provide different memory characteristics.

Although the memory circuit 310 can be any of a number of different types of memories, the present description uses a 3D NAND Vertical Channel array as an example for purposes of illustration. An example of such a structure is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer.

Figure 4:
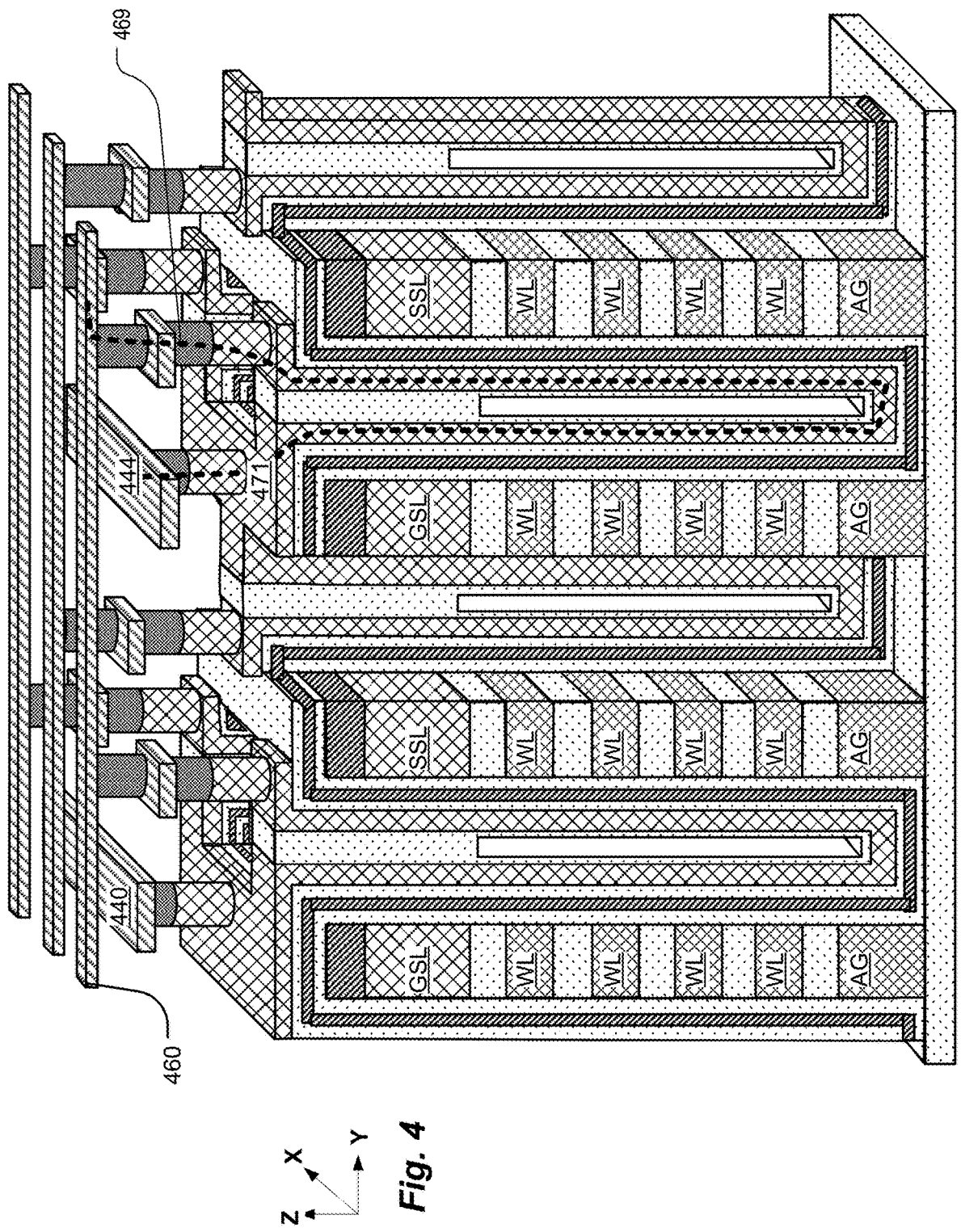
FIG. 4 is a perspective view of a 3D U-shaped memory structure which may be used with aspects of the invention.

FIG. 4 is a perspective view of a 3D U-shaped memory structure in which each string of cells extends down along one side of a gap, across the gap at the bottom, and back up the other side of the gap. A circuit path 469 as shown in FIG. 4 illustrates the current flow for a U-shaped NAND string which is connected between the source reference conductor line 444 in the bit line 460. The structure shows a plurality of active pillars between corresponding even and odd stacks of conductive strips. The active pillars comprise semiconductor films having outside surfaces and inside surfaces. The outside surfaces are disposed on the data storage structures on the sidewalls of the corresponding even and odd stacks forming a 3D array of memory cells. The memory cells are connected to form a current path from an upper and to a lower end of the even vertical channel film, and from a lower end to an upper end of the odd vertical channel film.

In the memory device of FIG. 4, stacks of conductive strips are separated by trenches. Referring to the conductive strips in first and second stacks, a configuration for interconnection to the U-shaped NAND strings can be described. The first and second stacks of conductive strips have sidewalls on first and second sides of the trench separating the stacks. Data storage structures are formed on the sidewalls of the strips in the trenches. Vertical channel structures are disposed in the trenches between the first and second stacks. Each vertical channel structure includes a first semiconductor film and a second semiconductor film disposed vertically in contact with the data storage structures on opposing sides of the trench, which are electrically connected at the bottom of the trench. An upper strip in a first stack is configured as a gate of a first switch, e.g. an SSL (string select line) switch, having a channel in the first semiconductor film, and an upper strip of a second stack is configured as a gate of a second switch, e.g. a GSL (ground select line, also called common select line) switch having a channel in the second semiconductor film. Intermediate level strips in the first and second stacks are configured as word lines. Bottom strips in the first and second stacks are configured as assist gates (AG). A patterned conductor layer or layers overlie the stacks. A first interlayer connector connects a first conductor (e.g. bit line 460) to a top surface of the first semiconductor film in an active pillar. A second interlayer connector connects a second conductor (e.g. source reference conductor line 440) to a top surface of the second semiconductor film in a vertical channel structure. Also, additional vertical channel structures disposed between the same first and second stacks are configured so that the second semiconductor films on the second side of the trench are all electrically connected, and can share connection to the same source reference line. Furthermore, the additional vertical channel structures between the same first and second stacks are configured so that the first semiconductor films on the first side of the trench are electrically separated, and can be individually connected to separate bit lines using individual interlayer connectors (e.g. third interlayer connectors).

As used herein, layers which are termed "above" or "below" other layers, can in various embodiments be separated from such other layers by one or more intervening layers. If no intervening layer is intended, then the terms "immediately above" or "immediately below" are used herein. The same interpretation is intended for layers being described as "superposing", "underlying" or "over" or "overlying" another layer. Additionally, a first layer is said to "overlie" a second layer if the first layer is closer to the active surface of the device, which is also referred to herein as the "topside" of the device. Similarly, a second layer is said to "underlie" a first layer if the second layer is closer to the rear surface of the device, which is also referred to herein as the "backside" of the device. If a chip is turned upside down, that does not alter which surface is the topside and which is the backside.

A vertical channel structure between the third stack and the second stack includes a first semiconductor film along the first side of the trench on the sidewall of the second stack between the third and second stacks, and a second semiconductor film along a second side of the trench between the third and second stacks. The first semiconductor film of the vertical channel structure between the third stack and the second stack can be electrically connected (by portion 471) to the second semiconductor film of the vertical channel structure between the first stack and the second stack. More detail about the structure of FIG. 4, as well as methods for fabricating it, can be found in Lue U.S. Pat. No. 10,211,218, incorporated by reference herein.

In the structure of FIG. 4, bit lines 460 extend in the Y-direction, and word line strips (labeled WL in the drawing) extend in the X-direction. SSL, GSL and AG strips also extend in the X-direction.

Figure 5:
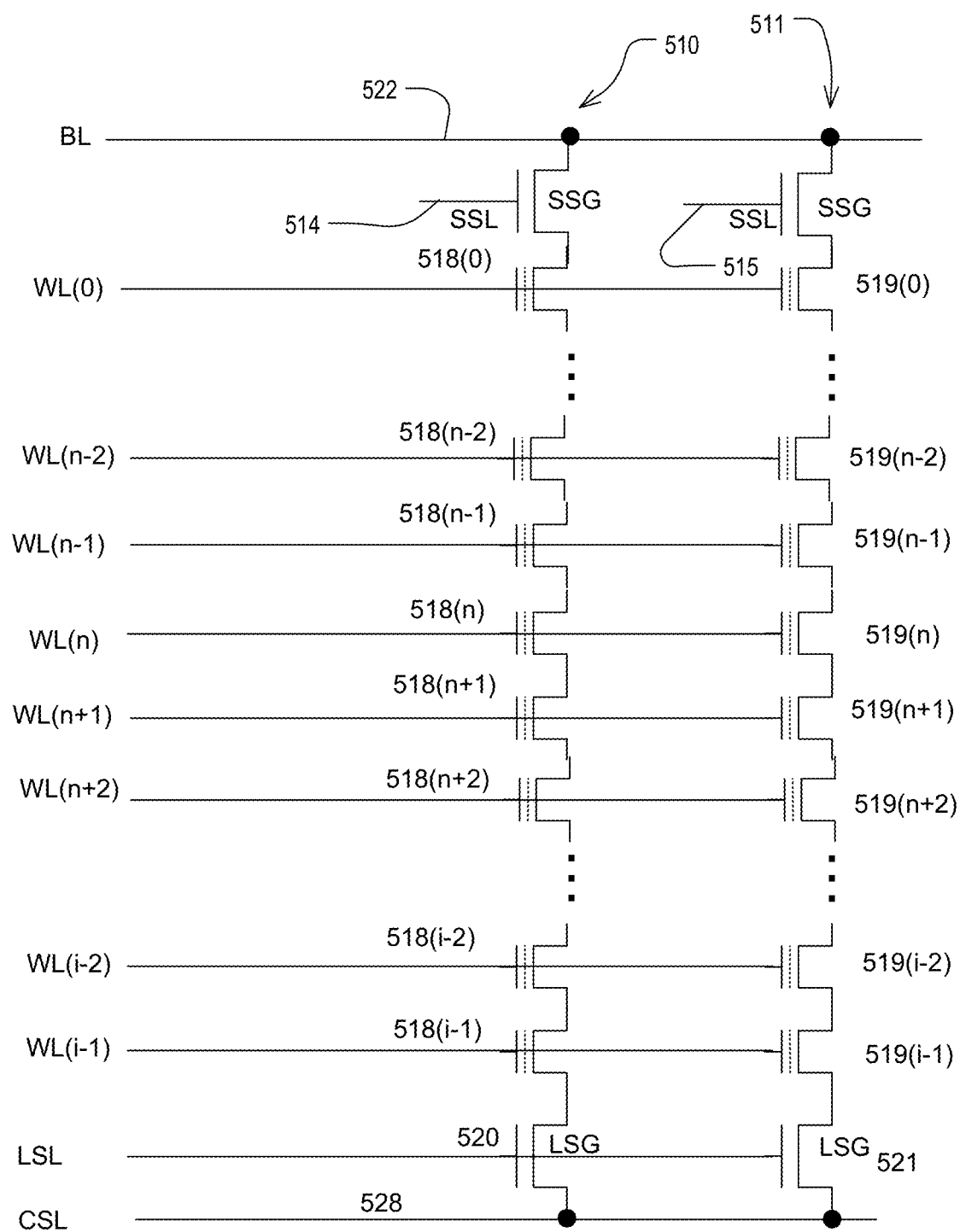
FIG. 5 is a simplified circuit diagram for parts of the memory structure of FIG. 4.

FIG. 5 is a simplified circuit diagram showing the memory cells and access transistors in two of the U-shaped strings of the example memory array of FIG. 4, numbered in FIG. 5 as 510, 511. Each string contains a number 'i' of series-connected memory cells. The memory cells in string 510 are labeled 518(0) . . . 518(i−1) (representatively 518), whereas the memory cells in string 511 are labeled 519(0) . . . 519(i−1) (representatively 519). Each of the memory cells 518 and 519 includes a source terminal, a drain terminal and a control gate. Because of the electrical interchangeability of source and drain in many transistors, these two terminals are sometimes referred to herein collectively as "current path terminals". The series connection of the transistors in a string is a series connection of the current path terminals of the transistors in the string.

The string 510 also includes a string select gate and a lower select gate (more accurately called a ground select gate for a U-shaped memory array) series connected on opposite sides of the memory cells 518 of the string. More particularly, each string select gate 514 and a lower select gate 520 includes a control gate electrode and two current path terminals, and the current path terminals are connected in series with the current path terminals of the memory cells 518 of the string. Similarly, the string 511 also includes a string select gate 515 and a lower select gate 521 series connected on opposite sides of the memory cells 519 of the string. The two strings 510, 511 share a single bit line conductor 522, connected to the drain terminal of both string select gates. The control gates of the two string select gates are connected to separate string select lines (514 in string 510 and 515 in string 511), thereby permitting selectable communication between the bit line 522 and the respective memory cell strings 510 and 511. The two strings also share a single common select line 528, connected to the source terminals of both lower select gates, and a common lower select line 520 connected to the control gates of both lower select gates.

The memory also includes i separate local word line conductors WL(0) ... WL(i−1) (representatively WL), each formed in a separate word line strip as shown in the memory array of FIG. 4. The word line strips are formed in various planes of the memory array of FIG. 4, and one corresponding to each of the memory cells 518 in string 510. Corresponding memory cells 519 in string 511 are located in corresponding planes as those in string 510. Each of the local word line conductors WL is connected to the control gate electrode of the corresponding memory cell 518 in string 510, and many are also connected to the control gate electrode in a corresponding memory cell 519 in string 511. Thus it can be seen that each of the strings intersect the local word line conductors, and the memory cells of the string are located at cross-points between the local word line conductors and the strings.

To program cells in the memory, control circuitry 526 first erases the entire block of cells, which drains any charge on the trapping layers. Control circuitry (not shown in FIG. 5) then programs one row (in FIG. 5) of cells at a time, by applying appropriate voltages to selected and unselected SSLs, bit lines and local word lines. A cell is programmed when the voltages are arranged such that the electric field across the trapping layer in the dielectric charge trapping structure, from the control gate electrode to the channel, is sufficiently high to enable Fowler Nordheim tunneling of electrons from the channel onto the trapping layer. Programming is inhibited by arranging the voltages such that the electric field is too small to cause such tunneling.

Figure 6:
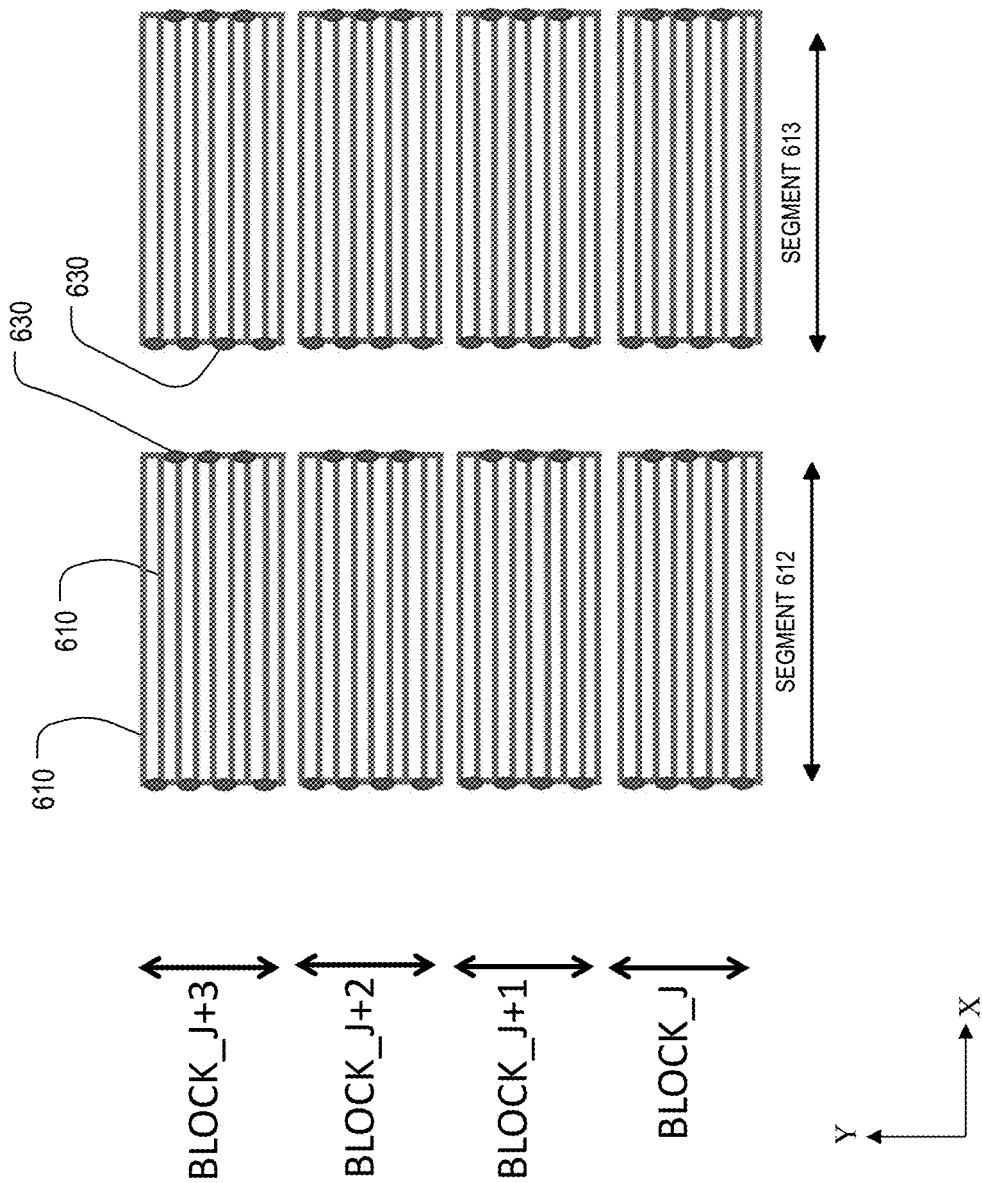
FIGS. 6, 7, 8, 9, 10 and 11 are layout (plan) views of different conductive layers of a memory chip according to aspects of the invention.

FIG. 6 is a layout view of a first metal layer overlying four 3D blocks of a memory array comprising U-shaped NAND strings as describe above. The four blocks are separated in the Y-direction and are labeled Block J, Block J+1, Block J+2 and Block J+3. Each block is segmented in the X-direction; only two segments 612 and 613 are shown, though typically they are many segments long. Each segment is shown illustratively as containing nine local common source line (CSL) conductors 610 extending in the X-direction. These local CSLs 610 are formed in a metal layer above the semiconductor stacks, for example ML1. Other global conductors (not shown) that may be formed in ML1 include global GSL lines and global SSL lines. Referring to Block J, segment 612, all the local CSLs in ML1 are connected together at one end or the other and to interlayer conductors 630 for further connection to higher metal layers.

Figure 7:
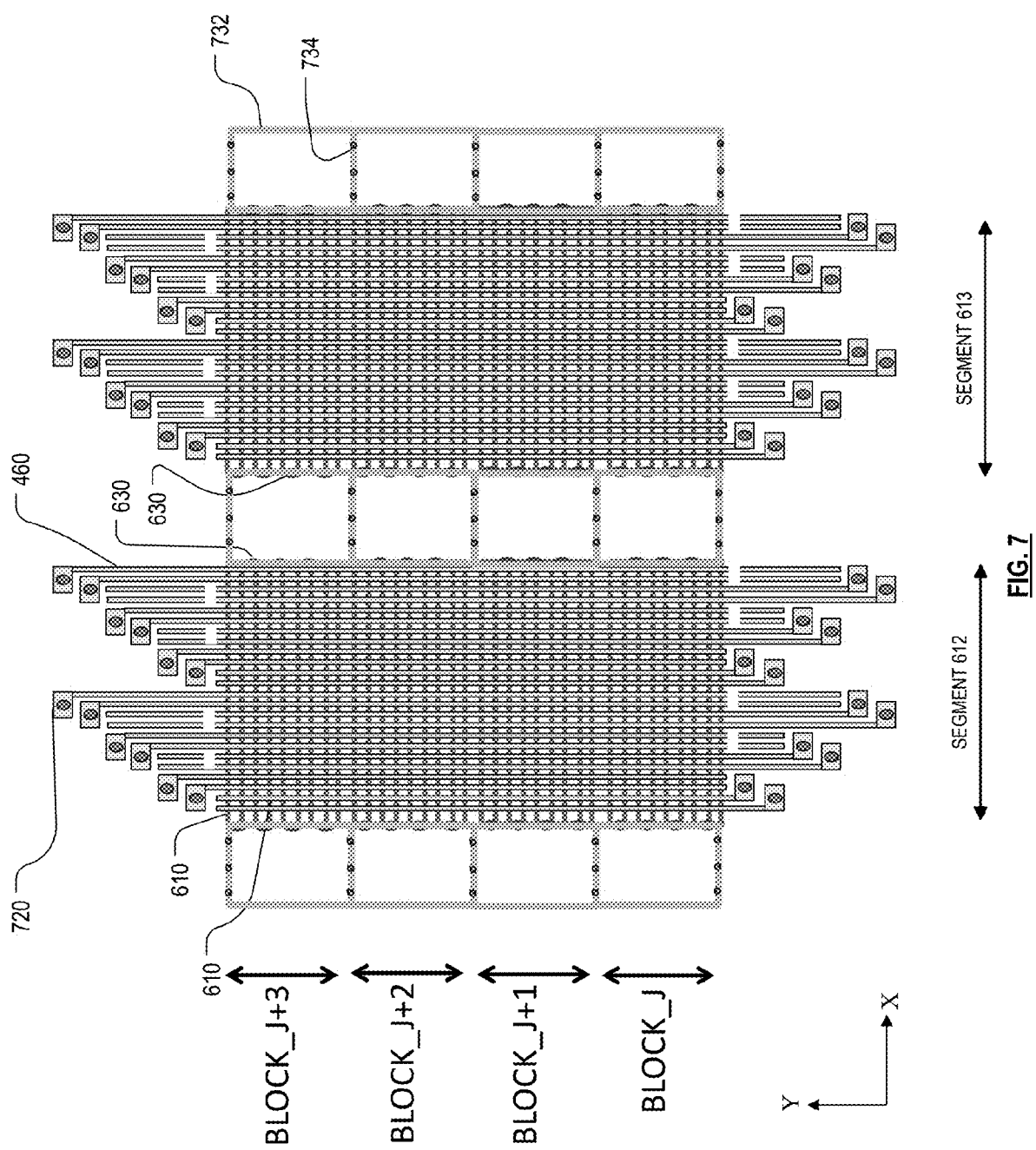

FIG. 7 is a layout view in which some of the pertinent conductors in the next higher metal layer ML2 are added to those in ML1 as shown in FIG. 6. The conductors in ML2 include global bit lines (GBL) 460 extending in the Y-direction. Each of the metal layers is separated from the metal layers above and below by a dielectric layer (not shown). As can be seen in FIG. 4, the GBLs 460 are connected to underlying memory cell strings, at one end of each 'U'. Such connections pass through interlayer conductors in the dielectric layer(s) below the GBLs 460. Each of the GBLs 460 terminates at one end or the other with a via landing pad 720 for interlayer connection to an RDL layer above, as described hereinafter. As used herein, a "landing pad" is a region of conductive material on one layer of a chip which facilitates electrical interconnection through an interlayer conductor (also sometimes referred to herein as a via) to a conductor on another layer of the same chip. It differs from "bonding pad" in that a bonding pad is used for interconnection outside the chip.

Figure 8:
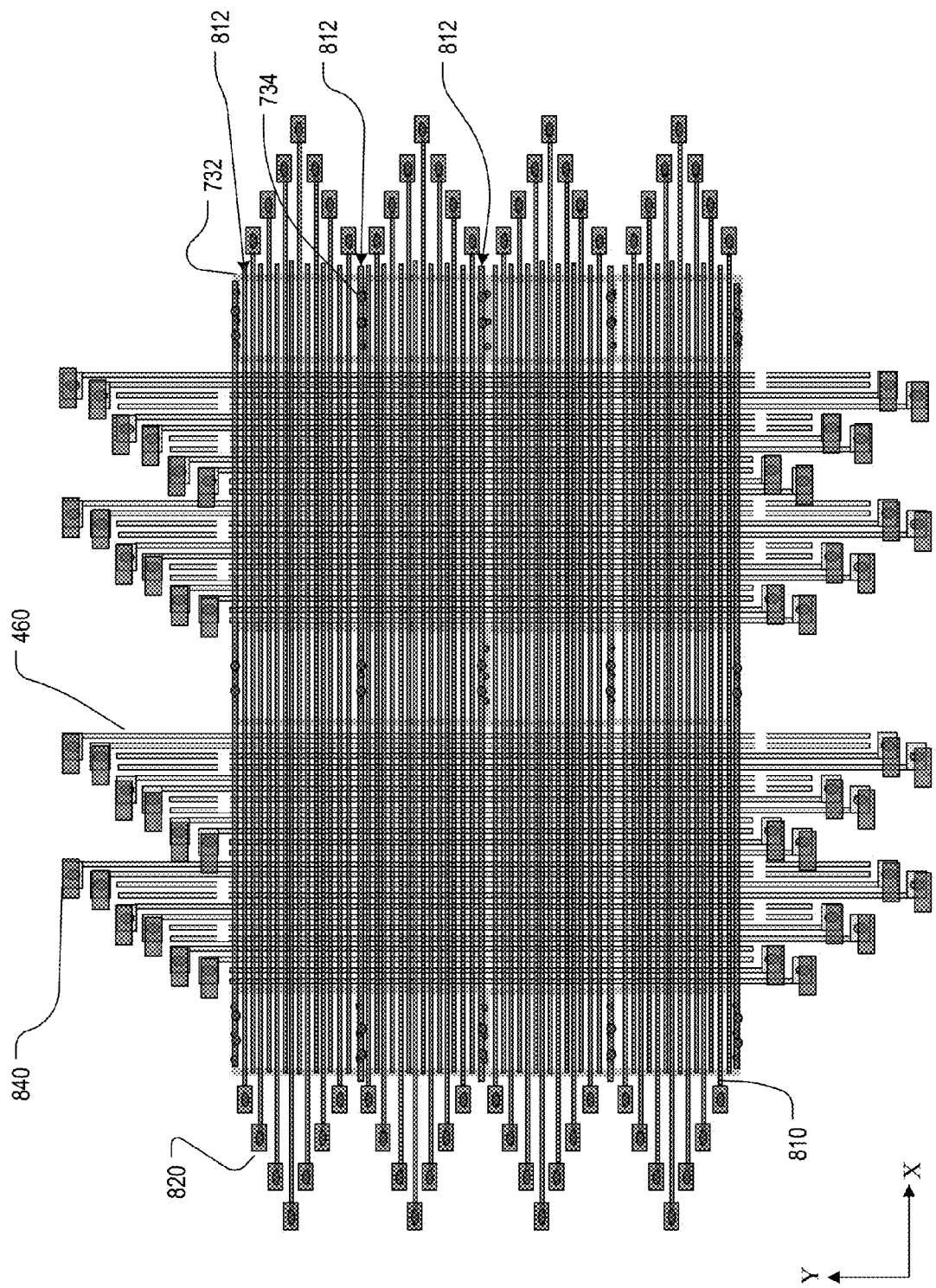

In embodiments in which the underlying word line strips are fabricated in polysilicon, the word line strips are preferably connected to a set of metal global word lines (GWL) 810 in an overlying layer. These are shown in FIG. 8, which shows GWLs 810 as well as some other pertinent conductors in the next metal layer ML3 added to those in FIG. 7. Word line interlayer conductors (not shown) connect the GWLs 810 to individual underlying word line strips (now called local word lines LWL), which may terminate in stair-step fashion as illustrated symbolically in FIG. 2. For clarity of illustration, the local CSLs 610 from FIG. 6 are no longer shown in FIG. 7, nor are the ML2 CSL conductors 732 from FIG. 7. But the interlayer conductors 734 connect the ML2 CSL conductors to further ML3 common source lines 812. The GWLs and ML3 CSLs extend in the X-direction As discussed above, the GWLs 810 are connected via interlayer conductors to the local word lines below, which terminate in stair step fashion in order to permit separate vertical interlayer conductors for each LWL or group of LWLs as required by the particular memory array architecture. The use of GWLs additional to the LWLs below is useful in array architectures such as that of FIG. 4, because the LWLs are formed typically in polysilicon, which has large RC parasitics. Connection to a metal GWL periodically along the length of the word lines helps to reduce the RC parasitics to an acceptable level. Each of the GWLs 810 terminates at one end or the other with a landing pad 820 for interlayer connection to an RDL layer above, as described hereinafter. In the embodiment of FIG. 8, landing pads 820 occur at alternating ends and at varying distances longitudinally from the landing pads 614. This allows space for wider landing pads 820, which helps to relax the registration accuracy requirements for higher layers. Also shown in FIG. 8 are GBL landing pads 840, which are formed directly above, and connected via interlayer conductors, to ML2 GBL landing pads 720 in FIG. 7.

Note that not all memory arrays that can be used with aspects of the invention necessarily have both global word lines and local word lines; some have only one kind of word line, and others have more than two kinds of word lines. As used herein, the term "word line" or WL is intended to be generic to all of these kinds of word lines. Similarly, not all memory arrays that can be used with aspects of the invention necessarily have both global bit lines and local bit lines; some have only one kind of bit line, and others have more than two kinds of bit lines. As used herein, the term "bit line" or BL is intended to be generic to all of these kinds of bit lines.

The ML3 CSLs 812 in FIG. 8 also extend in the X-direction and are formed in the same metal layer as the GWLs 810. The CSLs 812 are connected via interlayer conductors (not shown) to the ends of the U-shaped memory strings which are opposite the ends to which the GBLs 460 are connected. Note that in different embodiments, the various conductive interconnect layers shown and described herein can occur in a different order than as set forth herein.

Thus the memory array nodes which are to be connected to bonding pads for connection to the peripheral chip 212 include CSLs 812, GWLs 810, GBL's 460, SSLs, GSLs, and in some embodiments, access gate lines (AGL). However, In order to maximize the number of signals that can be transmitted across the interconnect interface 381, the interconnect locations 332, are typically laid out in a regular grid pattern which has a minimum pitch that can be relied upon to register adequately with the corresponding interconnect locations 334 on the peripheral chip 212, given the placement accuracy of the registration equipment. Thus it is not possible in general to provide an interconnect location 332 which is directly above the landing pad to which each signal will connect in the underlying layers. Some redistribution of the signal nodes is required, involving some additional lateral signal transmission. Such redistribution increases the length of signal travel and therefore RC parasitics. But instead of trying to minimize the overall lateral length of lateral redistribution signal travel, in an aspect of the invention, embodiments herein prioritize the types of signals to be routed first, to the nearest interconnect locations 334, allowing each subsequently routed signal type to be routed over longer distances than the previous signal type. In particular, in an aspect of the invention, particularly for NAND technology CSL lines 812 are routed first via minimal paths, because CSL loading is critical due to the IR drop. The CSL collects all string currents in many embodiments, which may lead to a high I*R value which can affect cell behavior. Bit lines (such as GBLs 460) are routed next to nearby pads, because they too carry significant current (though less than CSLs). Finally, signals controlling gates of MOS transistors are routed last to the remaining pads since they carry the least current. These include the GWLs 810, then the SSLs and GSLs.

Figure 9:
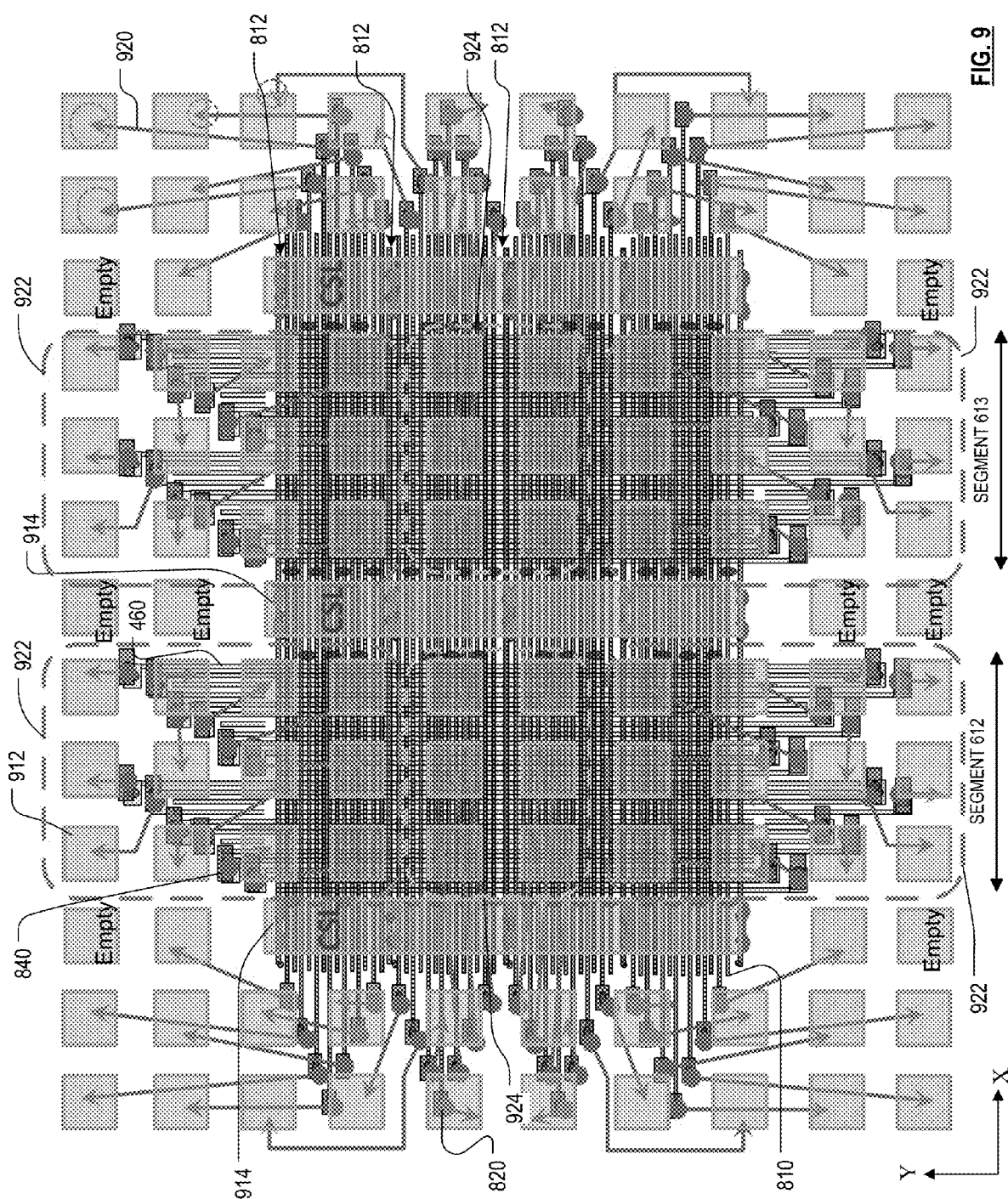

FIG. 9 is a layout view of the memory circuit chip 210 with a grid of bonding pads 912 superimposed on top. Also shown are a set of arrows 920 to indicate which GBL and GWL landing pads 840 and 820 are connected to which bonding pads 912. The connections indicated by arrows 920 occur in a redistribution (RDL) metal layer above the metal layer in which the landing pads are formed, and below the chip interconnect surface 382 on which the bonding pads 912 are exposed. For example, if the GWLs 810 and CSLs 812 are formed in metal layer ML3, then the RDL may be in a metal layer ML4 and the bonding pads 912 may be formed in a metal layer ML5. Note that while the arrows 920 are shown in FIG. 9 include diagonals, in another embodiment only right angle "Manhattan" routing is used in the RDL layer.

It can be seen in FIG. 9 that the CSLs 812 have been given first preference for short routes to their bonding pads. In particular, the bonding pads 914 for the CSLs 812 are positioned directly above the landing pads for the CSLs 812. The GBLs 460 have been given second preference for short routes to their bonding pads, and the GWLs 810 have been given third preference. In particular, it is preferred that the average lateral signal travel distance between a GBL landing pad 840 and its assigned bonding pad 912 which is positive (i.e. there is some lateral travel), but less than the average lateral signal travel distance between the GWL landing pads 820 and their assigned bonding pads 912.

As used herein, "lateral signal travel distance" refers to the sum of the conductor lengths along which the signal actually travels to reach its destination pad. In a Manhattan-routed RDL layer, for example, the lateral signal travel distance is the total absolute RDL length in the X-direction plus the total absolute RDL length in the Y-direction of the RDL conductor. In a direct-routed RDL layer, for example, the term refers to the Euclidean distance between the two pads. Additionally, as used herein, a "lateral" distance, or a "lateral" relationship, refers to displacement as projected onto the X-Y plane. It includes displacement in the X-direction, displacement in the Y-direction, and displacement in both the X- and Y-directions. Vertical displacement (in the Z-direction), if any, is ignored when considering displacement "laterally". That is, the route is projected onto the lateral plane before the X and Y displacements are measured.

Additionally, it can be seen in FIG. 9 that the grid of bonding pads 912 is larger in both the X-direction and the Y-direction than the memory array. For purposes of the present discussion, a "column" of the bonding pads 912 is defined as forming a straight line of bonding pads in the Y-direction whereas a "row" of the bonding pads 912 is defined as forming a straight line of bonding pads in the X-direction. With this definition, it is also preferred that all of the GBL landing pads 840 for GBLs 460 which overlie a single segment of the array in the X-direction, are assigned bonding pads 912 in "columns" which overlie the same segment of the array. Said another way, it is preferred that all the GBL landing pads 840 for GBLs 460 which are positioned laterally between a single pair of CSL bonding pads 914 are assigned bonding pads 912 in "columns" which are also positioned laterally between the same single pair of CSL bonding pads 914. It can be seen that both of the above descriptions are true for the bonding pad assignments for GBL landing pads 840 in FIG. 9, and at the same time it is not true that all of the GWL landing pads 820 for GWLs 810 positioned laterally over a single block of the array are assigned bonding pads 912 in a "row" of the grid which are also positioned over the same block of the array.

FIG. 9 also indicates by broken lines, regions 922 of the bonding pads which are assigned to GBL landing pads 840. It can be seen that within each lateral segment of the array, these regions 922 include pads at both ends of the GBLs 460 but exclude a region of pads 924 which overlie the GBLs 460 but are assigned to GWL landing pads 820. The bonding pads in each region 922 are arranged in adjacent rows and in adjacent columns, as are the bonding pads in region 924. Within each lateral segment of the array, region 924 is positioned centrally in the Y-direction, laterally between the two regions 922 in that segment. Preferably, all of the bonding pads which are connected to bit line landing pads are included in first and third sets of adjacent rows of bonding pads, and none are included in a second set of adjacent rows of bonding pads located laterally between the first and third sets of rows. Further, some (at least one) of the bonding pads in the second set of adjacent rows are connected to word line landing pads. As used herein, two items are "adjacent" to each other if they are not separated by another item of the same type. For example, two lines are considered "adjacent" to each other if there is no intervening line between them, even if the two lines do not touch each other. Immediate adjacency is not required by the term "adjacent" unless called for explicitly.

It is also prefened, as in the example of FIG. 9, that all the GBL landing pads 840 are assigned bonding pads 912 in "columns" which either overlie or are laterally adjacent to respective GBL landing pad 840. It is not true in FIG. 9 that all of the GWL landing pads 820 are assigned bonding pads 912 in "rows" of the grid which either overlie or are laterally adjacent to the respective GWL landing pad 820.

Figure 10:
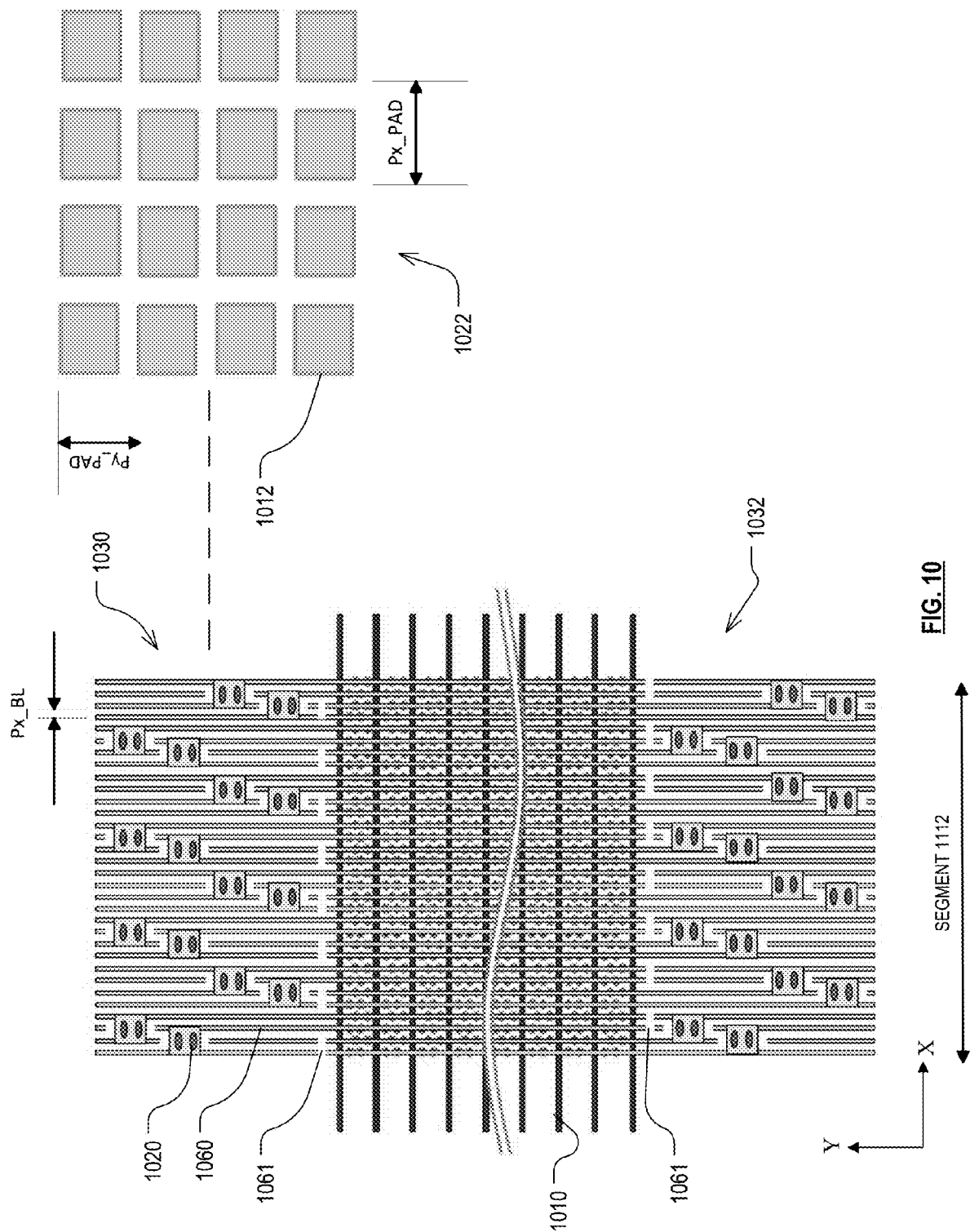

FIG. 10 is a layout view of another arrangement of global word lines GWL 1010 and global bit lines GBL 1060, with landing pads 1020 shown for the GBLs 1060. Though not shown, all of the illustrated GBLs 1060 are disposed laterally within a single segment 1112 of the underlying array, but the illustrated GWLs 1010 are disposed across all blocks covered by the illustrated GBLs 1060. The GBLs 1060 are broken at gaps 1061 to terminate conduction. In the example of FIG. 10 there are 32 GBLs 1060, with 16 of them terminating at landing pads 1020 on what will be referred to herein as the "north" side 1030 of the array and 16 of them terminating at landing pads 1020 on what will be referred to herein as the "south" side 1032 of the array. (The "north" side of the array is shown laterally above the GWLs 1010 in the drawing and the "south" side of the array is shown laterally below the GWLs 1010 in the drawing.) Therefore, 16 bonding pads 1012 from the grid are needed for assignment to the landing pads 1020 on the north side of the array and 16 are needed for assignment to the landing pads 1020 on the south side of the array. One of the sub-grids 1022 of 16 bonding pads 1012 is illustrated in the drawing.

Figure 11:
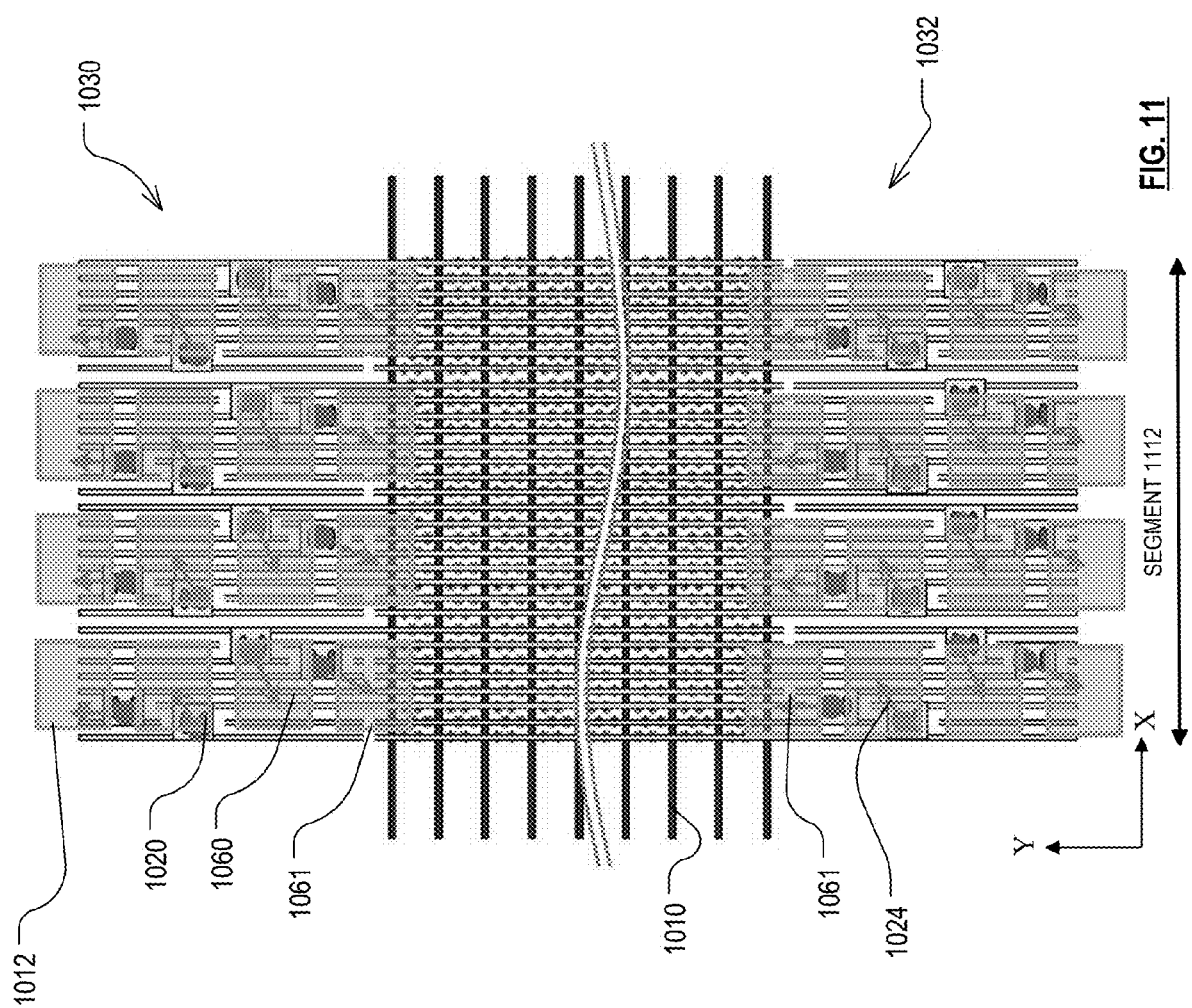

FIG. 11 is a layout view of the arrangement of FIG. 10, with the 32 bonding pads 1012 shown, as well as arrows 1024 indicating the assignment of bonding pads 1012 to GBL landing pads 1020. It can be seen that all of the GBL landing pads 1020 are assigned to bonding pads 1012 in the nearest column of bonding pads 1012. For GBL landing pads 1020 that directly underlie a column of bonding pads 1012, the landing pad 1020 is assigned to a bonding pad 1012 in the column of bonding pads 1012 which they underlie. For GBL landing pads 1020 that occur laterally between two columns of bonding pads 1012, the landing pad 1020 is assigned to a bonding pad 1012 in the laterally nearest column of bonding pads 1012. As used herein, if a GBL landing pad 1020 is positioned mid-way between two columns of bonding pads 1012, both columns are considered to be a "nearest" column.

Preferably, the grid of bonding pads 1012 is registered relative to the GBL landing pads 1020 such that a centerline (in the Y-direction) of the sub-grid laterally on the north side 1030 of the array aligns with a centerline (in the Y-direction) of the GBL landing pads 1020 on the north side of the array which span the same segment 1112 of the array. Similarly, preferably, the grid of bonding pads 1012 is registered relative to the GBL landing pads 1020 such that a centerline (in the Y-direction) of the sub-grid laterally on the south side 1032 of the array aligns with a centerline (in the Y-direction) of the GBL landing pads 1020 on the south side of the array which span the same segment 1112 of the array. As used herein, the centerline in a particular direction of a group of landing pads is a line orthogonal to the particular direction which satisfies the criterion that the sum of the distances orthogonally to the centerline from each of the landing pads on one side of the centerline, equals the sum of the distances orthogonally to the centerline from each of the landing pads on the other side of the centerline.

Preferably the grid of bonding pads 1012 is registered relative to the GBL landing pads 1020 also such that a centerline (in the X-direction) of the sub-grid laterally on the north side 1030 of the array aligns with a centerline (in the X-direction) of the GBL landing pads 1020 on the north side of the array which span the same segment 1112 of the array. Similarly, preferably, the grid of bonding pads 1012 is registered relative to the GBL landing pads 1020 such that a centerline (in the X-direction) of the sub-grid laterally on the south side 1032 of the array aligns with a centerline (in the X-direction) of the GBL landing pads 1020 on the south side of the array which span the same segment 1112 of the array.

Preferably bonding pads 1012 are assigned to GBL landing pads 1020 by first determining how columns of bonding pads 1012 (NX_PAD) fit within one array segment in the X-direction, given the minimum pitch in the X-direction of the bonding pads 1012 (Px_PAD); dividing half the number of GBLs 1060 within the segment by the number Nx_PAD, to determine the number of bonding pads 1012 (Ny PAD) that are required in the Y-direction in each of the two sub-grids of bonding pads 1012, aligning the center points of each sub-grid with the center points of the array of GBL landing pads 1020 on the same side 1030 or 1032 of the memory array, in both the X-direction and the Y-direction; and assigning each of the GBL landing pads 1020 to the laterally nearest bonding pad 1012 of the sub-grids.

Preferably, in an arrangement such as that of FIG. 11, the grid of bonding pads 1012 is registered relative to the GBL landing pads 1020 such that the GBL RDL length $L_{BL\_RDL}$ meets the following condition:

$$L_{BL\_RDL} < \tfrac{1}{4} * Py\_PAD * (Px\_PAD/Px\_BL)$$

where Py_PAD is the pitch in the Y-direction of the bonding pads 1012,

Px_PAD is the pitch in the X-direction of the bonding pads 1012, and

Px_BL is the pitch in the X-direction of the GBLs 1060. The pitches Py_PAD, Px_PAD, and Px_BL are defined as indicated in FIG. 10.

Figure 12:
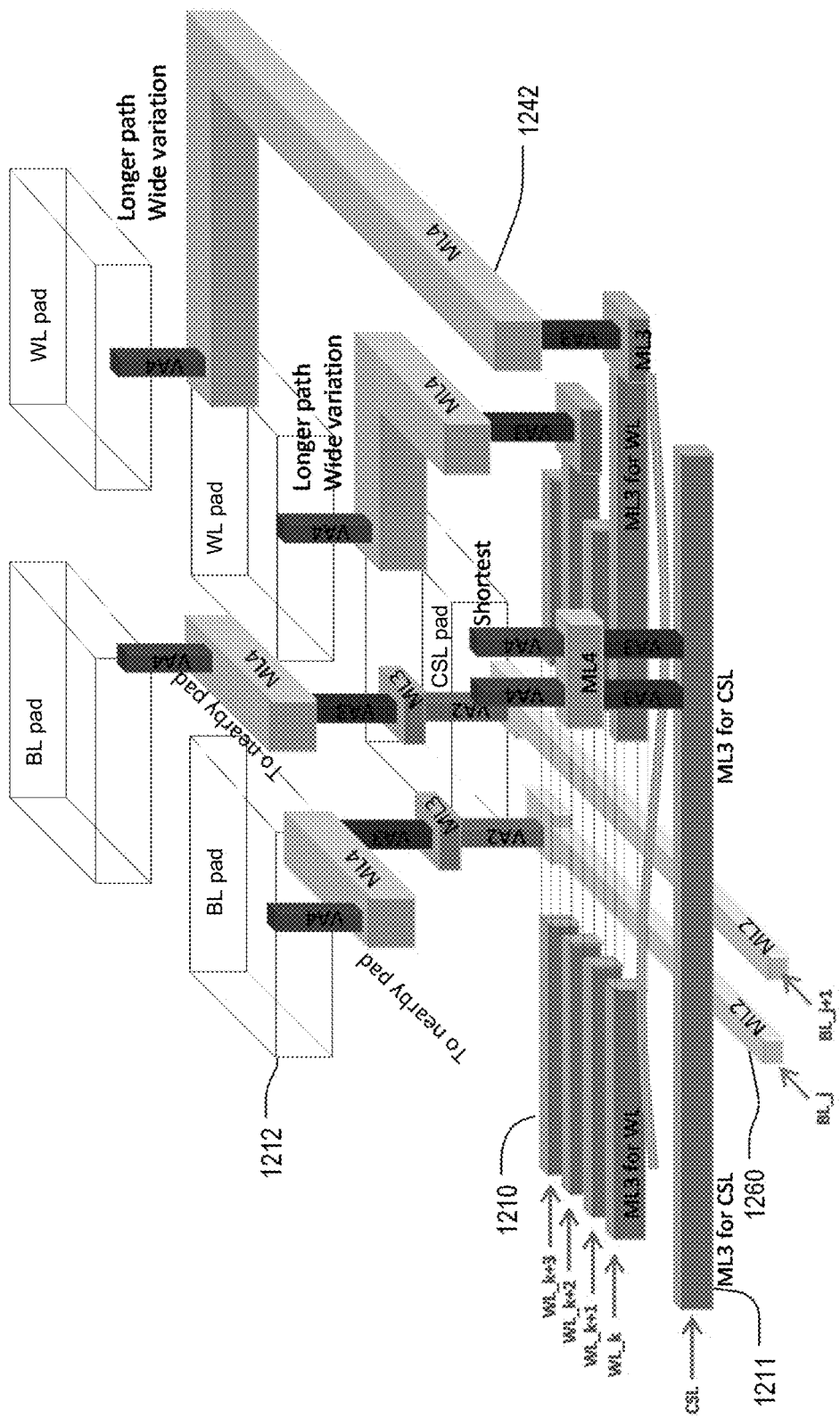
FIG. 12 is a symbolic perspective view of several upper layers of a memory circuit chip according to an embodiment of the invention.

FIG. 12 is a symbolic perspective view of several upper layers of a memory circuit chip 210 according to an embodiment of the invention. GBLs 1260 are illustrated as being formed in a metal layer ML2, and the GWLs 1210 are illustrated as being formed in the next higher metal layer ML3. The CSL conductors 1211 also share metal layer ML3. The redistribution conductors 1242 are formed in an RDL layer ML4 above ML3, and the bonding pads 1212 are formed in a metal layer ML5 above ML4. Interlayer conductors are shown as well. These include interlayer conductors VA2 connecting the GBLs 1260 to landing pads in ML3; conductors VA3 connecting components in ML3 to RDL conductors 1242 in ML4, and conductors VA4 connecting components in ML4 to the bonding pads 1212 in ML5. It can be seen that the CSL conductors 1211 are connected to bonding pads 1212 directly above the CSL conductors 1211; the GBLs 1260 are routed through relatively short RDL conductors 1242 to laterally nearby bonding pads 1212; and the GWLs 1210 are routed through relatively longer RDL conductors 1242 to other bonding pads 1212. The absolute lateral lengths of the RDL conductors for GWLs have a wider variance than the absolute lateral lengths of the RDL conductors for GBLs, which in turn have a wider variance than the absolute lateral lengths of the RDL conductors for CSLs. As used herein, the "variance" in the lengths of a population of conductors is the sum of the squares of the differences between the lengths of each of the conductors and the mean of the lengths of the conductors.

In the embodiments of FIGS. 7-11, it can be seen that the GBLs are organized in pairs. From left to right in the drawings, the first two GBLs point South, the next two GBLs point North, the following two GBLs point South, etc. This is only an example arrangement, and it will be understood that other organizations are possible. For example, in another embodiment the GBLs can alternate direction individually rather than in pairs. In such an embodiment, the grid of bonding pads 1012 is registered relative to the GBL landing pads 1020 such that the GBL RDL length $L_{BL\_RDL}$ meets the following revised condition:

$$LBL\_RDL < \tfrac{1}{2} * Py\_PAD * (Px\_PAD/Px\_BL)$$

Referring again to FIG. 2, it can be seen that the memory circuit chip 210 and the peripheral chip 212 are bonded face-to-face. In this way the peripheral chip 212 can directly control the memory cells on the memory circuit chip 210 through thousands of bonding pads, operating the memory array almost as if it were on-chip with the peripheral circuitry. But for many applications the resulting stacked chip still has to receive power to operate, and still must be accessible by external circuitry for control signals and data inputs and outputs. In order to solve this problem, through-silicon vias (TSV) preferably are used to connect circuit nodes on the peripheral chip 212, through the memory circuit chip 210 to its back side, to metal bumps used for connection to conductive traces on an underlying structure such as a printed circuit board. Such TSVs can be accommodated in the stacked device if, as is the case in FIG. 9, not all of the bonding pads 913 on the memory circuit chip 210 are assigned to memory array nodes. As can be seen in FIG. 9, some of the bonding pads 913 remain empty (unassigned) and unconnected to any of the memory array nodes. These unassigned bonding pads 913 thus are available for formation of TSVs.

In one process for accomplishing this, after the two chips 210 and 212 are fabricated, the memory circuit chip 210 is bonded face-to-face with the peripheral chip 212. The memory circuit chip 210 is then thinned by backside grinding and polishing, until it is sufficiently thin. For example the memory circuit chip 210 may be thinned to a thickness of around 50 microns. Next, with backside lithography, holes are etched into the silicon at the lateral positions of each desired unassigned bonding pad 913, all the way through to the internal surface of the bonding pad 913. These holes may for example have a diameter of around 1 micron and an aspect ratio of 50, and be located with a pitch as small as 5 microns. The holes are then filled with a conductive material such as tungsten, copper or polysilicon, and then the backside metal bump is applied over the exposed conductive fillings. The bonded, stacked device is then placed bump-side down on an underlying structure such as a printed circuit board, which can then supply power to and exchange input/output signals with the peripheral chip 212. These are communicated through the TSVs, through the bonding pads 913 on the active surface of the memory circuit chip 210, across the interface 381 to the mating bonding pads 334 on the peripheral chip 212, and into the circuitry of the peripheral chip 212. In one example embodiment, a memory circuit chip may have around 4000 bonding pads connected to global bit lines, around 4000 bonding pads connected to global word lines, and still have around a few tens to a few thousand bonding pads available for connection by TSV to external circuitry.

Figure 13:
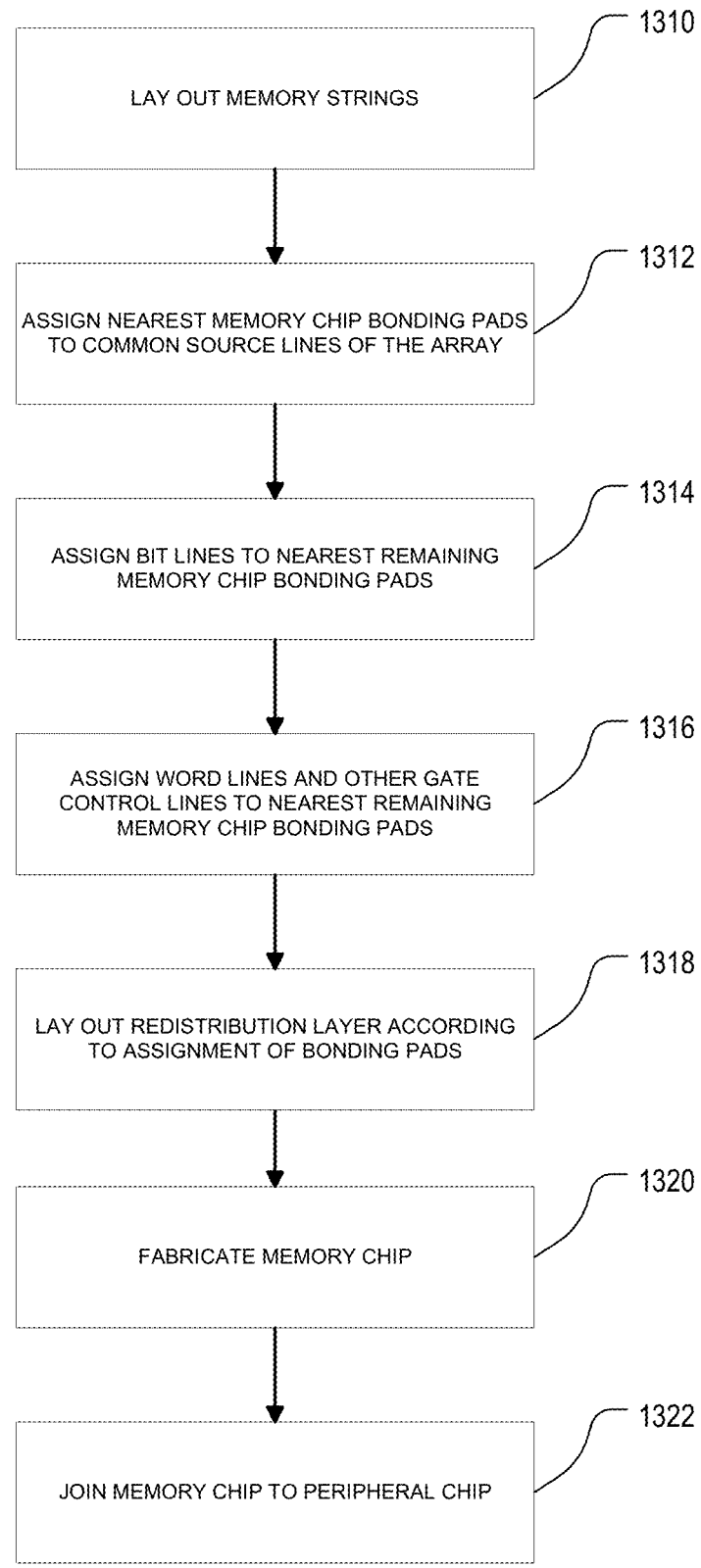
FIG. 13 is a flow chart illustrating a method for manufacturing a device incorporating features of the invention.

FIG. 13 is a flow chart illustrating a method for manufacturing a device incorporating features of the invention. In step 1310, the memory strings and other parts of the memory array structure (such as the parts illustrated in FIG. 4) are laid out. In step 1312 the nearest memory chip bonding pads are assigned to the common source lines of the array. In step 1314, the bit lines are assigned to the nearest of the remaining memory chip bonding pads. In step 1316, the word lines and other gate control lines are assigned to the nearest of the still remaining memory chip bonding pads. In step 1318, the RDL layer of the memory chip is laid out in accordance with these assignments of bonding pads. In step 1320 the memory chip is fabricated, and in step 1322 the memory chip is joined to a corresponding peripheral chip. as described elsewhere herein.

Figure 14:
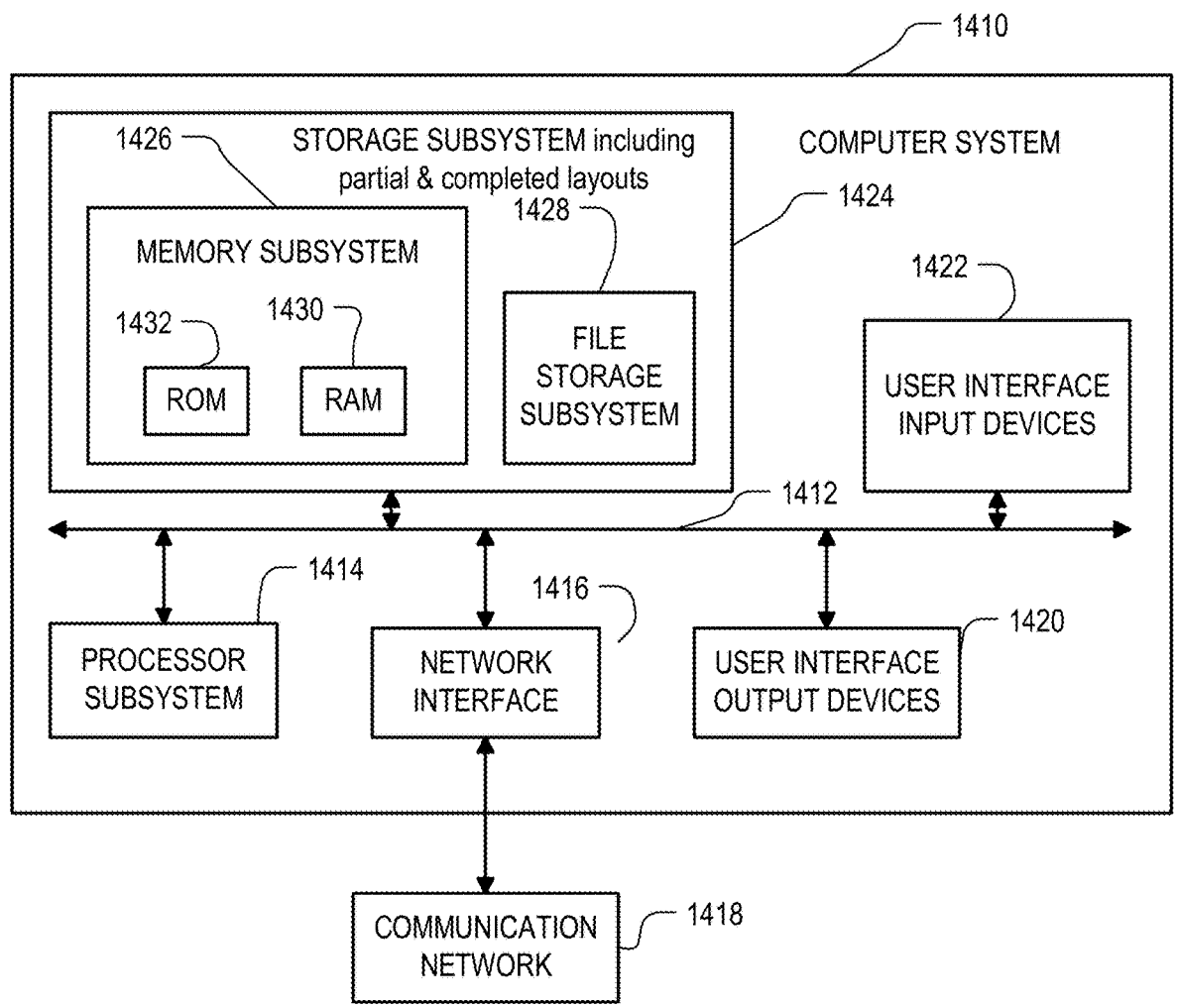
FIG. 14 is a block diagram of an example computer system that can be used to perform certain method steps incorporating aspects of the invention.

The layout and bonding pad assignment steps in FIG. 13 can be performed automatically by a computer system, such as that illustrated in the block diagram of FIG. 14. Referring to FIG. 14, computer system 1410 typically includes a processor subsystem 1414 which communicates with a number of peripheral devices via bus subsystem 1412. These peripheral devices may include a storage subsystem 1424, comprising a memory subsystem 1426 and a file storage subsystem 1428, user interface input devices 1422, user interface output devices 1420, and a network interface subsystem 1416. The input and output devices allow user interaction with computer system 1410. Network interface subsystem 1416 provides an interface to outside networks, including an interface to communication network 1418, and is coupled via communication network 1418 to corresponding interface devices in other computer systems. Communication network 1418 may comprise many interconnected computer systems and communication links. These communication links may be wireline links, optical links, wireless links, or any other mechanisms for communication of information, but typically it is an IP-based communication network. While in one embodiment, communication network 1418 is the Internet, in other embodiments, communication network 1418 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 1422 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1410 or onto computer network 1418.

User interface output devices 1420 may include a display subsystem, a printer, a fax machine, or non-visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 1410 to the user or to another machine or computer system.

Storage subsystem 1424 stores the basic programming and data constructs that provide the functionality of certain embodiments of the present invention. For example, the various modules implementing the functionality of certain embodiments of the invention may be stored in storage subsystem 1424. These software modules are generally executed by processor subsystem 1414. As another example, data structures describing partially- and fully-completed layouts of FIG. 13, as well as data structures keeping track of the assignments of memory chip bonding pads in FIG. 13, can be stored in storage subsystem 1424.

Memory subsystem 1426 typically includes a number of memories including a main random access memory (RAM) 1430 for storage of instructions and data during program execution and a read only memory (ROM) 1432 in which fixed instructions are stored. File storage subsystem 1428 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 1428. The host memory 1426 contains, among other things, computer instructions which, when executed by the processor subsystem 1414, cause the computer system to operate or perform functions as described herein. As used herein, processes and software that are said to run in or on "the host" or "the computer", execute on the processor subsystem 1414 in response to computer instructions and data in the host memory subsystem 1426 including any other local or remote storage for such instructions and data.

Bus subsystem 1412 provides a mechanism for letting the various components and subsystems of computer system 1410 communicate with each other as intended. Although bus subsystem 1412 is shown schematically as a single bus, alternative embodiments of the bus subsystem may use multiple busses.

Computer system 1410 itself can be of varying types including a personal computer, a portable computer, a workstation, a computer terminal, a network computer, a television, a mainframe, a server farm, or any other data processing system or user device. Due to the ever changing nature of computers and networks, the description of computer system 1410 depicted in FIG. 14 is intended only as a specific example for purposes of illustrating the preferred embodiments of the present invention. Many other configurations of computer system 1410 are possible having more or less components than the computer system depicted in FIG. 14.

In an embodiment, software code portions for performing any of the functions described herein can be stored at one location, and the retrieved and transmitted to the location of a computer system that will be executing them. The transmission may take the form of writing the code portions onto a non-transitory computer readable medium and physically delivering the medium to the target computer system, or it may take the form of transmitting the code portions electronically, such as via the Internet, toward the target computer system. As used herein, electronic transmission "toward" a target computer system is complete when the transmission leaves the source properly addressed to the target computer system.

As used herein, no distinction is intended between substances of an integrated circuit which are disposed in the substrate body itself, or disposed in an overlying layer of the substrate body. For example, all of the features of an integrated circuit, including wells, diffusions, STI regions, gate dielectric layers, gate conductors and cap layer materials, are all described equivalently herein as being either "on" the substrate or "in" the substrate, and no distinction is intended between the two words.

Applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. For example, although the description above uses a 3D NAND Vertical Channel array as an example for purposes of illustration, aspects of the invention can also be used with other types of memory arrays, such as 3D NAND Vertical Gate, advanced planar NAND, and NOR flash technologies.

Furthermore, without limitation, any and all variations described, suggested in any document incorporated by reference in this patent application or in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A device comprising a memory chip having a memory chip interconnect surface with a set of memory chip bonding pads formed at respective ones of a set of memory chip interconnect locations, wherein the memory chip includes a memory array having a plurality of bit lines and a plurality of word lines, and wherein each of the bit lines and each of the word lines includes a respective landing pad connected via redistribution conductors of the memory chip to respective ones of the set of memory chip bonding pads, the redistribution conductors for the bit lines having a positive average lateral signal travel distance which is less than that of the redistribution conductors for the word lines.

2. The device of claim 1, wherein the memory array further includes a plurality of string select lines in communication with string select line gate control nodes of the memory array, wherein each of the string select lines includes a respective string select line landing pad connected via redistribution conductors of the memory chip to respective string select line ones of the set of memory chip bonding pads, the redistribution conductors for the bit lines having a positive average lateral signal travel distance which is less than that of the redistribution conductors for the string select lines.

3. The device of claim 1, wherein the bit lines in the plurality of bit lines are all oriented in a bit line direction and are grouped into segments of bit lines which are spaced from each other in a direction orthogonal to the bit line direction, each of the bit line segments having a respective subset of at least three of the bit lines and having a constant pitch, and each of the bit line segments being spaced from each of its adjacent bit line segments by respective bit line gaps larger than the pitch, wherein the memory chip bonding pads form a plurality of bonding pad columns extending in the bit line direction and include a respective subset of the bonding pad columns overlying each of the bit line segments, the bonding pads in the plurality of bonding pad columns further including at least one gap column overlying each of the bit line gaps, and wherein all of the bit line landing pads in each given one of the bit line segments is connected to a respective one of the bonding pads in the bonding pad columns overlying the given bit line segment.

4. The device of claim 3, wherein the word lines in the plurality of word lines are all oriented in a direction orthogonal to the bit lines,
wherein the memory chip bonding pads further form a plurality of bonding pad rows extending orthogonally to the bit lines, the bonding pad rows including bonding pad rows containing bonding pads which overlie at least one of the word lines and bonding pad rows that do not contain any bonding pads which overlie any of the word lines, and
wherein at least one of the word line landing pads is connected to a bonding pad in one of the bonding pad rows which do not contain bonding pads that overlie any of the word lines.

5. The device of claim 1, wherein the memory chip bonding pads which are connected to bit line landing pads and word line landing pads are collectively arranged in rows each extending orthogonally to the bit lines, the rows including a first set of adjacent rows, a second set of adjacent rows, and an intermediate set of adjacent rows disposed between the first and second sets of adjacent rows,
wherein all of the memory chip bonding pads which are connected to bit line landing pads are included in the first and second sets of adjacent rows, and
wherein at least one of the memory chip bonding pads which are connected to word line landing pads are included in the intermediate set of adjacent rows.

6. The device of claim 1, wherein the memory chip bonding pads which are connected to bit line landing pads and word line landing pads are collectively arranged in columns which extend parallel to the bit lines, each of the columns in a plurality of adjacent ones of the bonding pad columns including a bonding pad that overlies at least one of the bit lines, wherein the landing pad for each given one of the bit lines in the plurality of bit lines is connected to a bonding pad in a bonding pad column which either overlies the given bit line or is a nearest column to the given bit line in a direction orthogonal to the bit lines.

7. The device of claim 6, wherein the memory chip bonding pads which are connected to bit line landing pads and word line landing pads are collectively arranged further in rows which extend orthogonally to the bit lines, each of the rows in a plurality of adjacent ones of the bonding pad rows including a bonding pad that overlies at least one of the word lines, wherein the landing pad for at least one given one of the word lines in the plurality of word lines is connected to a bonding pad in a bonding pad row which neither overlies the given word line nor is a nearest row to the given word line.

8. The device of claim 1, wherein the bit lines in the plurality of bit lines are all oriented in a bit line direction and are grouped into segments of bit lines which are spaced from each other in a direction orthogonal to the bit line direction, each of the segments having a respective subset of at least three of the bit lines and having a constant pitch, and each of the segments being spaced from each of its adjacent segments by respective gaps larger than the pitch,
wherein the bit line landing pads for bit lines in one of the segments are divided into first and second groups of the bit line landing pads, the first and second groups of bit line landing pads being separated from each other in the bit line direction by the word lines, and
wherein the memory chip bonding pads which are connected to bit line landing pads in the first group of bit line landing pads forms a first sub-grid of bit line bonding pads, the first sub-grid of bit line bonding pads having a centerline in the bit line direction which aligns with a centerline in the bit line direction of the bit line landing pads in the first group of bit line landing pads.

9. The device of claim 8, wherein the first sub-grid of bit line bonding pads further has a centerline orthogonal to the bit line direction which aligns with a centerline orthogonal to the bit line direction of the bit line landing pads in the first group of bit line landing pads.

10. The device of claim 9, wherein the memory chip bonding pads which are connected to bit line landing pads in the second group of bit line landing pads forms a second sub-grid of bit line bonding pads, the second sub-grid of bit line bonding pads having a centerline in the bit line direction which aligns with a centerline in the bit line direction of the bit line landing pads in the second group of bit line landing pads, and
wherein the second sub-grid of bit line bonding pads further has a centerline orthogonal to the bit line direction which aligns with a centerline orthogonal to the bit line direction of the bit line landing pads in the second group of bit line landing pads.

11. The device of claim 1, wherein the bit lines in the plurality of bit lines are all oriented in a bit line direction and are grouped into segments of bit lines which are spaced from each other in a direction orthogonal to the bit line direction, each of the segments having a respective subset of at least three of the bit lines, the bit lines within a particular one of the segments having a regular pitch Px_BL,
wherein the memory chip bonding pads which are connected to bit line landing pads and word line landing pads are collectively arranged in columns which extend parallel to the bit lines and rows which extend orthogonally to the bit lines, the columns having a regular pitch Px_PAD and the rows having a regular pitch Py_PAD, and
wherein each of the redistribution conductors for bit lines has a respective lateral signal travel distance $L_{BL\_RDL}$ which meets the following condition:

$$L_{BL\_RDL} < \tfrac{1}{4} * Py\_PAD * (Px\_PAD/Px\_BL).$$

12. The device of claim 11, wherein the bit lines within each individual one of the segments has the regular pitch Px_BL, and
wherein each of the redistribution conductors for bit lines has a respective lateral signal travel distance $L_{BL\_RDL}$ which meets the condition.

13. The device of claim 12, wherein at least one of the redistribution conductors for word lines has a lateral signal travel distance $L_{WL\_RDL}$ which does not meet the condition.

14. The device of claim 1, wherein the redistribution conductors for the word lines have lateral signal travel distances which has a larger variance than that of the redistribution conductors for the bit lines.

15. The device of claim 1, further comprising a peripheral chip having a peripheral chip interconnect surface with a set of peripheral chip bonding pads formed at respective ones of a set of peripheral chip interconnect locations,
wherein the peripheral chip interconnect surface of the peripheral chip is joined to the memory chip interconnect surface of the memory chip circuit at an interconnect interface, and wherein the peripheral chip includes sense amplifiers and circuits configured to provide signals for operation of the memory circuit to the plurality of word lines and the plurality of bit lines, through mating ones of the memory chip bonding pads and the peripheral chip bonding pads.

16. The device of claim 15, wherein the peripheral chip further includes a member of the group consisting of a processor, a central processing unit, a logic controller, an arithmetic logic unit, an array processing unit, a graphics processing unit, a memory management unit, cache memory, SRAM, and an input/output controller.

17. The device of claim 15, wherein the set of memory chip bonding pads further includes a set of additional memory chip bonding pads, and wherein the memory chip further includes:
   a backside surface opposite the memory chip interconnect surface; and
   a plurality of TSV conductors each passing through the memory chip from memory chip interconnect surface to the memory chip backside surface and each providing an electrical connection point on the backside surface corresponding to a respective one of the additional memory chip bonding pads on the memory chip interconnect surface, and
   wherein the peripheral chip includes peripheral chip bonding pads which are in electrical communication with the additional memory chip bonding pads through mating ones of the peripheral chip bonding pads.

18. The device of claim 17, wherein the TSV conductors provide power, control and/or data signals to the peripheral chip.

19. The device of claim 1, wherein the set of memory chip bonding pads further includes a set of additional memory chip bonding pads, and wherein the memory chip further includes:
   a backside surface opposite the memory chip interconnect surface; and
   a plurality of TSV conductors each passing through the memory chip from memory chip interconnect surface to the memory chip backside surface and each providing an electrical connection point on the backside surface corresponding to a respective one of the additional memory chip bonding pads on the memory chip interconnect surface.

20. The device of claim 19, wherein none of the TSV conductors are also connected on the memory chip to any nodes of the memory array.

21. A method for making a device comprising:
   forming a memory chip having a memory chip interconnect surface with a set of memory chip bonding pads formed at respective ones of a set of memory chip interconnect locations; and
   including in the memory chip a memory array having a plurality of bit lines and a plurality of word lines,
   wherein each of the bit lines and each of the word lines includes a respective landing pad connected via redistribution conductors of the memory chip to respective ones of the set of memory chip bonding pads, the redistribution conductors for the bit lines having a positive average lateral signal travel distance which is less than that of the redistribution conductors for the word lines.

22. The method of claim 21, further comprising:
   forming a peripheral chip having a peripheral chip interconnect surface with a set of peripheral chip bonding pads formed at respective ones of a set of peripheral chip interconnect locations; and
   joining the peripheral chip interconnect surface of the peripheral chip to the memory chip interconnect surface of the memory chip circuit at an interconnect interface,
   wherein the peripheral chip includes sense amplifiers and circuits configured to provide signals for operation of the memory circuit to the plurality of word lines and the plurality of bit lines, through mating ones of the memory chip bonding pads and the peripheral chip bonding pads.

23. The method of claim 22, wherein the memory chip includes a backside surface opposite the memory chip interconnect surface, and wherein the set of memory chip bonding pads further includes a set of additional memory chip bonding pads, the method further comprising:
   forming a plurality of TSV conductors each passing through the memory chip from memory chip interconnect surface to the memory chip backside surface and each providing an electrical connection point on the backside surface corresponding to a respective one of the additional memory chip bonding pads on the memory chip interconnect surface; and
   providing the peripheral chip with peripheral chip bonding pads which are in electrical communication with the additional memory chip bonding pads through mating ones of the peripheral chip bonding pads.

24. The method of claim 21, wherein the memory chip includes a backside surface opposite the memory chip interconnect surface, and wherein the set of memory chip bonding pads further includes a set of additional memory chip bonding pads, the method further comprising:
   forming a plurality of TSV conductors each passing through the memory chip from memory chip interconnect surface to the memory chip backside surface and each providing an electrical connection point on the backside surface corresponding to a respective one of the additional memory chip bonding pads on the memory chip interconnect surface.

25. The method of claim 24, wherein none of the TSV conductors are also connected on the memory chip to any nodes of the memory array.

* * * * *